(12) United States Patent
Tani et al.

(10) Patent No.: US 7,154,426 B2
(45) Date of Patent: Dec. 26, 2006

(54) ANALOG-DIGITAL CONVERTER WITH ADVANCED SCHEDULING

(75) Inventors: Kuniyuki Tani, Ogaki (JP); Atsushi Wada, Ogaki (JP); Shigeto Kobayashi, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/052,093

(22) Filed: Feb. 8, 2005

(65) Prior Publication Data

US 2005/0174277 A1    Aug. 11, 2005

(30) Foreign Application Priority Data

| Feb. 10, 2004 | (JP) | ............................. 2004-034285 |
| Feb. 24, 2004 | (JP) | ............................. 2004-048150 |
| Mar. 23, 2004 | (JP) | ............................. 2004-084486 |

(51) Int. Cl.
*H03M 1/12* (2006.01)

(52) U.S. Cl. ........................................ 341/155; 341/122

(58) Field of Classification Search ................ 341/155, 341/161, 122
See application file for complete search history.

(56) References Cited

U.S. PATENT DOCUMENTS

| 6,414,619 | B1* | 7/2002 | Swanson ..................... 341/155 |
| 6,535,157 | B1* | 3/2003 | Garrity et al. ............... 341/163 |
| 6,608,575 | B1* | 8/2003 | Bazarjani ..................... 341/143 |
| 6,628,217 | B1* | 9/2003 | Dunne ......................... 341/143 |
| 6,683,554 | B1* | 1/2004 | Nikai et al. .................. 341/161 |
| 6,909,391 | B1* | 6/2005 | Rossi .......................... 341/161 |
| 6,909,393 | B1* | 6/2005 | Atriss et al. ................ 341/163 |
| 7,002,506 | B1* | 2/2006 | Tadeparthy et al. ......... 341/161 |
| 2004/0125006 | A1* | 7/2004 | Tani et al. .................. 341/155 |

FOREIGN PATENT DOCUMENTS

| JP | 4-26229 | 1/1992 |
| WO | WO 2004054111 A2 * | 6/2004 |

\* cited by examiner

*Primary Examiner*—Rexford Barnie
*Assistant Examiner*—Joseph Lauture
(74) *Attorney, Agent, or Firm*—McDermott Will & Emery LLP

(57) ABSTRACT

A first amplifier circuit samples and holds an input analog signal and outputs the same to a subtracting circuit. An AD converter circuit converts the input analog signal into a digital value so as to retrieve a predetermined number of bits. A DA converter circuit converts the digital value derived from conversion by the AD converter circuit into an analog value. A subtracter circuit subtracts an output analog signal from the DA converter circuit from the analog signal input via a first switch or the first amplifier circuit. A second amplifier circuit amplifies an output analog signal from the subtracter circuit by a gain of 2 and outputs the amplified signal. An input switching circuit controls the order of inputs, i.e. the input analog signal and a reference voltage, to voltage comparison elements constituting the Ad converter circuit.

28 Claims, 24 Drawing Sheets

DIGITAL VALUE

ANALOG-DIGITAL CONVERTER WITH ADVANCED SCHEDULING

BACKGROUND OF THE INVENTION

1. Field of the Invention

The present invention relates to an analog-digital converter and, more particularly, to an analog-digital converter of a pipeline type and that of a cyclic type.

2. Description of the Related Art

In recent years, a variety of additional functions are built in mobile appliances such as a mobile telephone set, including the image pick-up function, the image playback function, the moving image pick-up function and the moving image playback function. In association with this, there is an increasing demand for miniaturization and power saving of an analog-digital converter (hereinafter, referred to as an AD converter). One mode of AD converter that addresses this demand is known as a cyclic AD converter which cycles through stages (see, for example, the Related art list No. 1). The Related art list No. 1 discloses an AD converter of a pipeline type comprising two stages that include a conversion part of a cyclic type.

Related Art List

1. Japanese Patent Application Laid-open No. 4-26229

The first stage of the AD converter illustrated in FIG. 1 of the Related art list No. 1 is provided with the sample and hold circuit S/H1 parallel with a system comprising the A/D converter AD1 and the DA converter DA1 of a parallel type. An analog signal input to the circuit is held by the sample and hold circuit S/H1 for a predetermined period of time.

Since the sample and hold circuit includes an operational amplifier, the output voltage range of the sample and hold circuit tends to be limited in a low voltage operation. Limited output voltage range of the sample and hold circuit in a low voltage operation causes degradation in characteristics such as distortion, with the result that the characteristics of the AD converter as a whole may become poor accordingly. When the sample and hold circuit is removed, a resultant timing error causes a period of time for comparison of the voltage value of the signal input to the AD converter circuit and a reference voltage value to be shortened or causes a period of time for amplification in the amplifier circuit to be shortened. When the period of time for amplification in the amplifier circuit is shortened, a settling time may not be secured.

SUMMARY OF THE INVENTION

The present invention is done in view of the aforementioned circumstances and its object is to provide a satisfactory period of time for AD conversion in an analog-digital converter that includes a time-shared AD conversion part, even when the timing of operation of constituting elements other than an AD conversion part varies.

The present invention according to an aspect provides an analog-digital converter. The analog-digital converter according to this aspect comprises: an analog-digital converter circuit converting an input analog signal into a digital value of a predetermined number of bits; and an input switching circuit switchably feeding a voltage value of the input analog signal and a predetermined reference voltage value to voltage comparison elements constituting the analog-digital converter circuit, wherein the input switching circuit switches between the voltage value of the analog signal and the reference voltage value in accordance with the timing of operation of elements other than the voltage comparison elements constituting the analog-digital converter.

Arbitrary combinations of the aforementioned constituting elements, and implementations of the invention in the form of methods, apparatus and systems may also be practiced as additional modes of the present invention.

Figure 1:
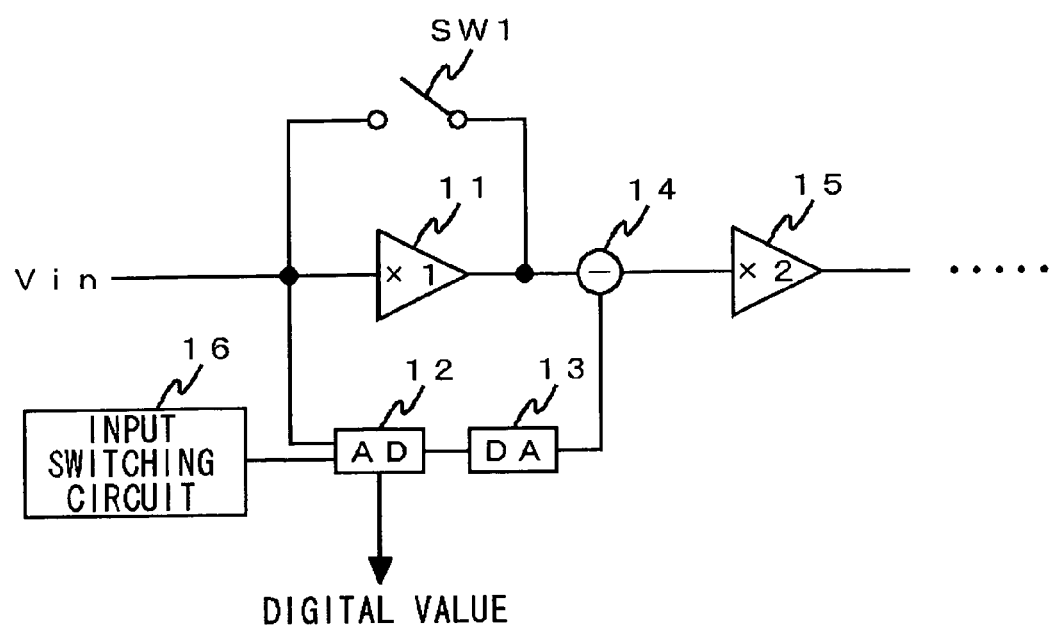
FIG. 1 is a partial circuit diagram illustrating the basic concept behind an AD converter according to a first embodiment of the present invention.

DETAILED DESCRIPTION OF THE INVENTION (First Embodiment)

A description will first be given of representative aspects of the first embodiment. The first embodiment according to one aspect provides an analog-digital converter. The analog-digital converter according to this aspect comprises: an analog-digital converter circuit converting an input analog signal into a digital value of a predetermined number of bits; and an input switching circuit switching between a voltage value of the analog signal and a predetermined reference voltage value for input to voltage comparison elements constituting the analog-digital converter circuit, wherein the input switching circuit switches between the voltage value of the analog signal and the reference voltage value in accordance with the timing of operation of elements other than the voltage comparison elements constituting the analog-digital converter.

According to this aspect, an input to the AD converter circuit can occur not only in the order of the input voltage value and the reference voltage value, but also in the reverse order. By switchably using the orders of input in accordance with the timing schedule of operation of other constituting elements (for example, in accordance with the order of sampling the input voltage), a period of time for comparison in the voltage comparison elements constituting the AD converter circuit is secured. Accordingly, regularly-timed operation of the constituting elements is ensured so that generation of a clock signal adapted for the operation is easy.

The first embodiment according to another aspect also provides an analog-digital converter. The analog-digital converter according to this aspect comprises: an analog-digital converter circuit converting an input analog signal into a digital value of a predetermined number of bits; a digital-analog converter circuit converting an output of the analog-digital converter into an analog signal; a subtracter circuit subtracting an output analog signal from the digital-analog circuit from the input analog signal; an amplifier circuit amplifying an output of the subtracter circuit; and an input switching circuit switching between a voltage value of the analog signal and a predetermined reference voltage value for input to voltage comparison elements constituting the analog-digital converter circuit, wherein the input switching circuit switches between the voltage value of the analog signal and the reference voltage value according to a timing schedule of the operation of the amplifier circuit.

According to this aspect, an input to the AD converter circuit can occur not only in the order of the input voltage value and the reference voltage value, but also in the reverse order. By switchably using the orders of input in accordance with the timing schedule of the operation of the amplifier circuit (for example, in accordance with the order occurring between an autozero period and an amplification period), a period of time for comparison in the voltage comparison elements constituting the AD converter circuit is secured. A period of time for amplification in the amplifier circuit is also secured. Accordingly, regularly-timed operation of the elements constituting the AD converter is ensured so that generation of a clock signal adapted for the operation is easy.

The first embodiment according to still another aspect also provides an analog-digital converter. The analog-digital converter according to this aspect comprises: an analog-digital converter circuit converting an input analog signal into a digital value of a predetermined number of bits; a digital-analog converter circuit converting an output of the analog-digital converter into an analog signal; a subtracter circuit subtracting an output analog signal from the digital-analog circuit from the input analog signal; an amplifier circuit amplifying an output of the subtracter circuit; an input switching circuit switching between a voltage value of the analog signal and a predetermined reference voltage value for input to voltage comparison elements constituting the analog-digital converter circuit; a sample and hold circuit provided between an input to the analog-digital converter and the subtracter circuit, and sampling and holding the input analog signal; and a switch connecting the input to the analog-digital converter with the subtracter circuit directly or via the sample and hold circuit, wherein the input switching circuit feeds the reference voltage value first and then the voltage value of the input analog signal, while the switch is selecting a direct route.

According to this aspect, the voltage comparison elements constituting the AD converter circuit are first supplied with the reference voltage value and then the voltage value of the input analog signal, while the switch is selecting the direct route. With this, the period of time for comparison in the voltage comparison elements is prevented from being shortened when the voltage value of the input analog signal is first fed to the element, thereby preventing an idle time in the amplifier circuit.

The first embodiment according to yet another aspect also provides an analog-digital converter. The analog-digital converter according to this aspect is an analog-digital converter of a pipeline type or a cyclic type comprising: an analog-digital converter circuit converting an input analog signal into a digital value of a predetermined number of bits; a digital-analog converter circuit converting an output of the analog-digital converter into an analog signal; a subtracter circuit subtracting an output analog signal from the digital-analog circuit from the input analog signal; an amplifier circuit amplifying an output of the subtracter circuit; and an input switching circuit switching between a voltage value of the analog signal and a predetermined reference voltage value for input to voltage comparison elements constituting the analog-digital converter circuit, wherein the input switching circuit switches between a voltage value of an input signal from a preceding stage, a voltage value of an input signal fed back from a subsequent stage and the reference voltage, in accordance with a timing schedule of the operation of the amplifier circuit.

According to this aspect, the order of inputs to the AD converter circuit occurring between a plurality of input voltage values and the reference voltage value are varied in accordance with the type of input. For example, inputs may occur in the order of the input voltage value and then the reference voltage value, or in the order of the reference voltage value and then the input voltage value. By switching between these orders of inputs in accordance with the timing schedule of the amplifier circuit, i.e., in accordance with, for example, the order occurring between the autozero period and the amplification period, the period for comparison in the voltage comparison elements constituting the AD converter circuit is secured. A period of time for amplification in the amplifier circuit is also secured. Accordingly, regularly-timed operation of the elements constituting the AD converter is ensured so that generation of a clock signal adapted for the operation is easy.

The input switching circuit may switch between a voltage value of a first input signal from a preceding stage, a first reference voltage value for the first input signal, a voltage value of a second input signal fed back from a subsequent stage and a second reference voltage value for the second input signal, in accordance with the timing schedule of the operation of the amplifier circuit. With this, input voltage values with different quantization levels can be processed for conversion.

A description will first be given of the basic concept behind the first embodiment. FIG. 1 is a partial circuit diagram illustrating the basic concept behind an AD converter according to the first embodiment. An input analog signal Vin is fed to a first amplifier circuit 11 and an AD converter circuit 12 when a first switch SW1 is turned off. The input analog signal Vin is fed to a subtracter circuit 14 and the AD converter circuit 12 via the first switch SW1, when the first switch SW1 is turned on.

The first amplifier circuit 11 samples and holds the input analog signal Vin and outputs the signal to the subtracter circuit 14. The first amplifier circuit 11 has a gain of 1 and functions as a sample and hold circuit. The AD converter circuit 12 converts the input analog signal into a digital value and retrieves a predetermined number of bits. The digital value thus retrieved is fed to an encoder (not shown) and a DA converter circuit 13. The DA converter circuit 13 converts the digital value produced by conversion by the AD converter circuit 12 into an analog value. The subtracter circuit 14 subtracts an output analog signal from the DA converter circuit 13 from the analog signal supplied via the first switch SW1 or the first amplifier circuit 11. A second amplifier circuit 15 amplifies an output analog signal from the subtracter circuit 14 by a factor of 2 and outputs the amplified signal to the subsequent stage. The gain of the second amplifier circuit 15 is arbitrary and is not limited to 2.

A plurality of voltage comparison elements are provided in the AD converter circuit 12, the number of elements being commensurate with the number of bits produced by conversion. The input analog signal Vin and a reference voltage Vref are selectively fed to each of the voltage comparison elements. Each of the voltage comparison element outputs a digital value determined according to whether the input analog signal Vin is greater or smaller than the reference voltage Vref. The input switching circuit 16 controls the timing of input of the input analog signal Vin and the reference voltage Vref to the voltage comparison element.

Thus, the subtracter circuit 14 of the AD converter of FIG. 1 is adapted to receive both the input analog signal Vin via the first switch SW1 and the output analog signal from the first amplifier circuit 11. An operational amplifier constituting the first amplifier circuit 11 has an inherent output voltage range. If an operational amplifier is adapted for a low-voltage operation, the output voltage range is correspondingly less extensive. When the first amplifier circuit 11 is not introduced, occurrence of a signal error is prevented. If the first amplifier circuit 11 is removed without taking any associated measures, however, it is possible for a timing error to occur. A circuit in which the first amplifier circuit 11 is not introduced may be used in a pre-production prototype. The prototype may be used to compare the characteristics occurring when the first amplifier circuit 11 is provided with those occurring when it is not. More specifically, such a prototype may be useful in a test mode or in switching from one application to another.

Figure 2:
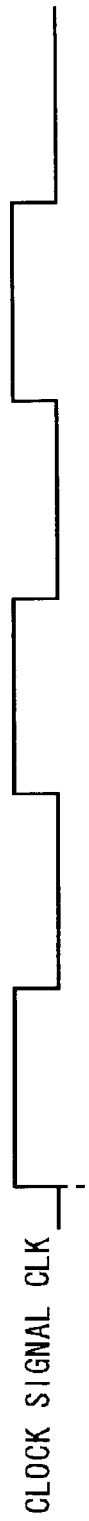
FIG. 2 is a timing chart illustrating an example of operation of the AD converter of FIG. 1.

A description will then be given of an example of operation of the AD converter of FIG. 1. FIG. 2 is a timing chart illustrating an example of operation of the AD converter of FIG. 1. Referring to FIG. 2, the first switch SW1 is turned on and off in cycles defined by a clock signal CLK. The input analog signal Vin is sampled by the first amplifier circuit 11 and the AD converter circuit 12 while the first switch SW1 is turned off and the clock signal CLK is high. The input switching circuit 16 selects the input analog signal Vin for input to the AD converter circuit 12. The first amplifier circuit 11 and the AD converter circuit 12 are in an autozero mode while the clock signal CLK remains high. In an autozero period, the circuits do not provide any output. The second amplifier circuit 15 is processing a signal input in a previous clock cycle for amplification and output. During this period of time, the reference voltage Vref is fed to the second amplifier circuit 15.

Subsequently, while the first switch SW1 remains turned off and the clock signal CLK is low, the first amplifier circuit 11 samples and holds the input analog signal Vin. The AD converter circuit 12 compares the input analog signal Vin with the reference voltage Vref and performs a conversion process accordingly. The input switching circuit 16 selects the reference voltage Vref and feeds the same to the AD converter circuit 12. The second amplifier circuit 15 is in an autozero mode and receives an output of the first amplifier circuit 11.

While the first switch SW1 is turned on, the first amplifier circuit 11 is turned off. While the clock signal CLK is high, the AD converter circuit 12 is in an autozero mode and receives the reference voltage Vref. The input switching circuit 16 selects the reference voltage Vref and feeds the same to the AD converter circuit 12. The second amplifier circuit 15 is processing a signal input in a previous clock cycle for amplification and output. During this period of time, the reference voltage Vref is fed to the second amplifier circuit 15.

While the first switch SW1 remains turned on and the clock signal CLK is low, the input analog signal Vin is sampled by the second amplifier circuit 15 and the AD converter circuit 12. The AD converter circuit 12 compares the reference voltage Vref with the input analog signal Vin and performs a conversion process accordingly. The input switching circuit 16 selects the input analog signal Vin for input to the AD converter circuit 12. The second amplifier circuit 15 is in an autozero mode and receives the input analog signal Vin.

Figure 3:
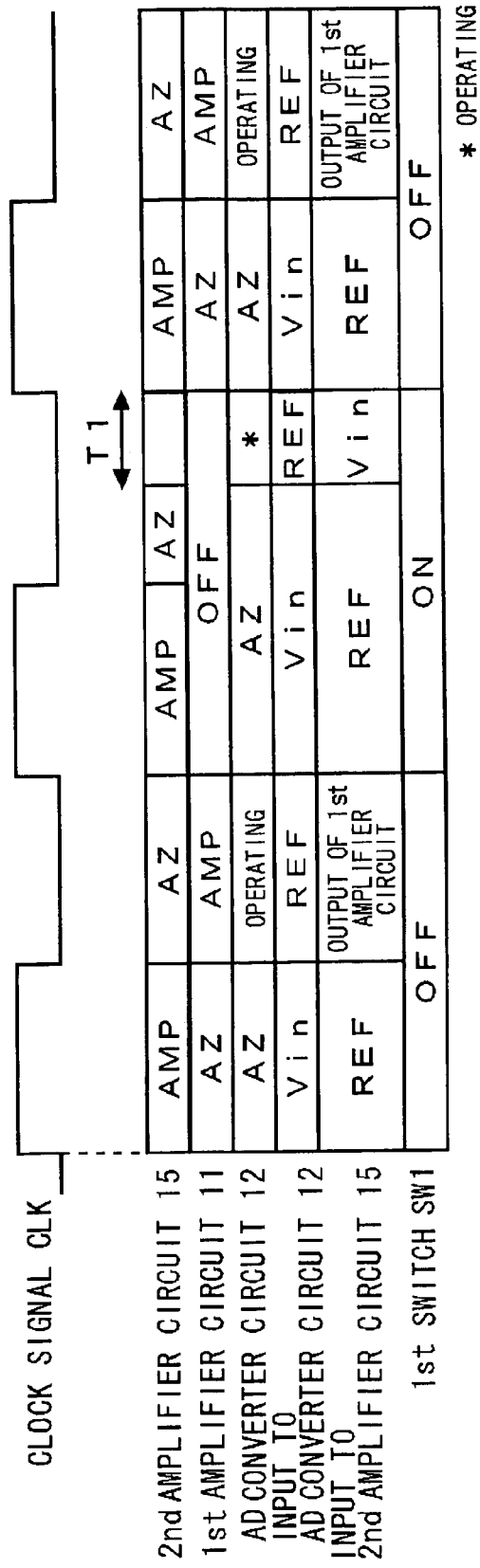
FIG. 3 is a timing chart illustrating a comparative example of operation of the AD converter of FIG. 1.

FIG. 3 is a timing chart illustrating a comparative example of operation of the AD converter of FIG. 1. Referring to FIG. 3, the first switch SW1 is turned on and off in cycles defined by a clock signal CLK. The operation performed while the first switch SW1 is turned off is the same as that of FIG. 2.

While the first switch SW1 is turned on, the first amplifier circuit 11 is turned off. While the clock signal CLK is high, the second amplifier circuit 15 is processing a signal input in a previous clock cycle for amplification and output. During this period of time, the reference voltage Vref is fed to the second amplifier circuit 15. The AD converter circuit 12 is in an autozero mode and receives the input analog signal Vin. The input switching circuit 16 selects the input analog signal Vin for input to the AD converter circuit 12.

Subsequently, while the first switch SW1 remains turned on and the clock signal CLK is low, the reference voltage Vref should be fed to the AD converter circuit 12 for comparison. Since the sampled value is determined in the AD converter circuit 12 when the voltage thereto is switched to the reference voltage Vref, the sampling of the input analog signal Vin by the second amplifier circuit 15 should also occur concurrently with this switching. Since the second amplifier circuit 15 can only sample the input analog signal Vin after the autozero period, however, the second amplifier circuit 15 has to sample in the middle of the low period instead of at the end thereof. The switching by input switching circuit 16 from the input analog signal Vin to the reference voltage Vref is therefore timed to concur with the sampling by the second amplifier circuit 15. The AD converter circuit 12 operates for comparison in a period when the input thereto remains switched to the reference voltage Vref. The second amplifier circuit 15 cannot start amplification after the input switching circuit 16 switches to the reference voltage Vref, and is placed in an inactive mode until the comparison is completed.

In this comparative example of operation, the input switching circuit 16 feeds only the input analog signal Vin to the AD converter circuit 12 while the AD converter circuit 12 is in an autozero mode. In contrast, in the example of operation of FIG. 2, the input to the AD converter circuit 12 in an autozero mode may be the input analog signal Vin or the reference voltage Vref. Due to this difference, an idle time of the second amplifier circuit 15, indicated by T1 in FIG. 3, is created. The period of time that can be consumed for comparison in the AD converter circuit 12 is correspondingly shortened. Further, a plurality of clock signals with different periods are required. In contrast, the first amplifier circuit 11, the second amplifier circuit 15 and the AD converter circuit 12 operate in strict synchronization with the first switch SW1. Accordingly, generation of a clock adapted for the operation is easy.

Figure 4:
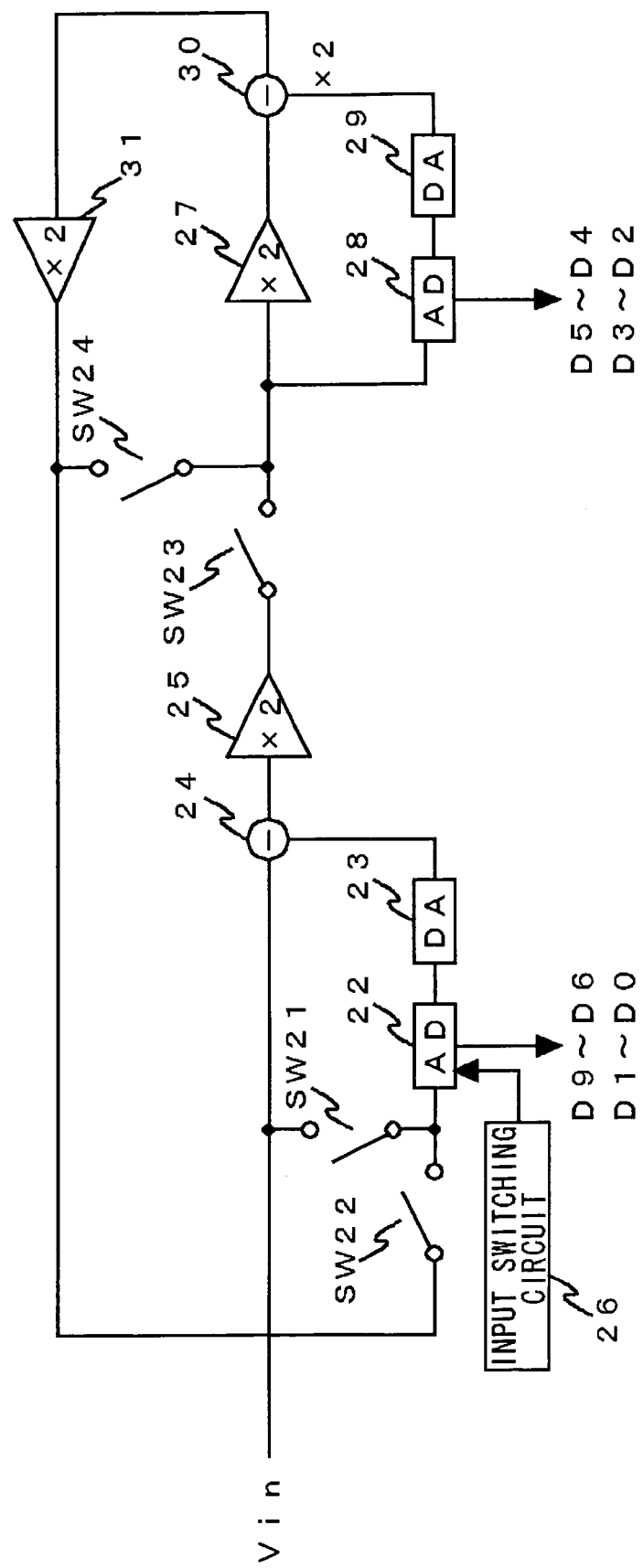
FIG. 4 illustrates the structure of an AD converter according to an example of the first embodiment.

A description will now be given of an example of AD converter using the basic structure described above. FIG. 4 illustrates the structure of an AD converter according to an example of the first embodiment. The AD converter according to this example is of a pipeline type comprising two stages each embodied by an AD conversion part of a cyclic type. The AD converter converts into the higher 4 bits (D9–D6) and the lower 2 bits (D1–D0) in the first stage, and into the intermediate bits (D5–D2) in the second stage.

In this AD converter, the input analog signal Vin is fed to a first AD converter circuit 22 via a first switch SW21. The first AD converter circuit 22 converts the input analog signal into a digital value of a maximum of 4 bits and outputs the value to an encoder (not shown) and a first DA converter circuit 23. The first DA converter circuit 23 converts the digital value of a maximum of 4 bits output from the first AD converter circuit 22 into an analog signal.

A first subtracter circuit 24 subtracts an output signal from the first DA converter circuit 23 from the input analog value. A second amplifier circuit 25 amplifies an output of the first subtracter circuit 24 and outputs the amplified output to a third amplifier circuit 27 and a second AD converter circuit 28 via a third switch SW23. The gain of the second amplifier circuit 25 is 2. The first subtracter circuit 24 and the second amplifier circuit 25 may be an integral subtracting amplifier circuit. An input switching circuit 26 switches between two analog signals and two reference voltages, generically referred to as reference voltages Vref, for input to voltage comparison elements constituting the first AD converter circuit 22. The ratio between the reference voltage Vref1 supplied when the first AD converter circuit 22 converts into the higher 4 bits (D9–D6) and the reference voltage Vref2 supplied when the first AD converter circuit 22 converts into the lower 2 bits (D1–D0) is 2:1. That is, the reference voltage Vref2, which is 1/2 of the reference voltage Vref1, is supplied for conversion into the lower 2 bits (D1–D0).

The second AD converter circuit 28 converts the input analog signal into a digital value of a maximum of 2 bits and outputs the value to an encoder (not shown) and a second DA converter circuit 29. The second DA converter circuit 29 converts the digital value of a maximum of 2 bits output from the second AD converter circuit 28 into an analog signal.

The third amplifier circuit 27 amplifies the input analog signal by a factor of 2 and outputs the amplified signal to a second subtracter circuit 30. The second subtracter circuit 30 subtracts an analog value output from the second DA converter circuit 29 from an analog value output from the second DA converter circuit 29. In association with the gain of the third amplifier circuit 27, the analog value output from the second DA converter circuit 29 is practically amplified by a factor of 2. A fourth amplifier circuit 31 amplifies an output of the second subtracter circuit 30 and feeds back the amplified output to the third amplifier circuit 27 and the second AD converter circuit 28 via a fourth switch SW24, or to the first DA converter circuit 22 via the third switch SW23. The gain of the fourth amplifier circuit 31 is 2. The second subtracter circuit 30 and the third amplifier circuit 27 may be an integral subtracting amplifier circuit.

Figure 5:
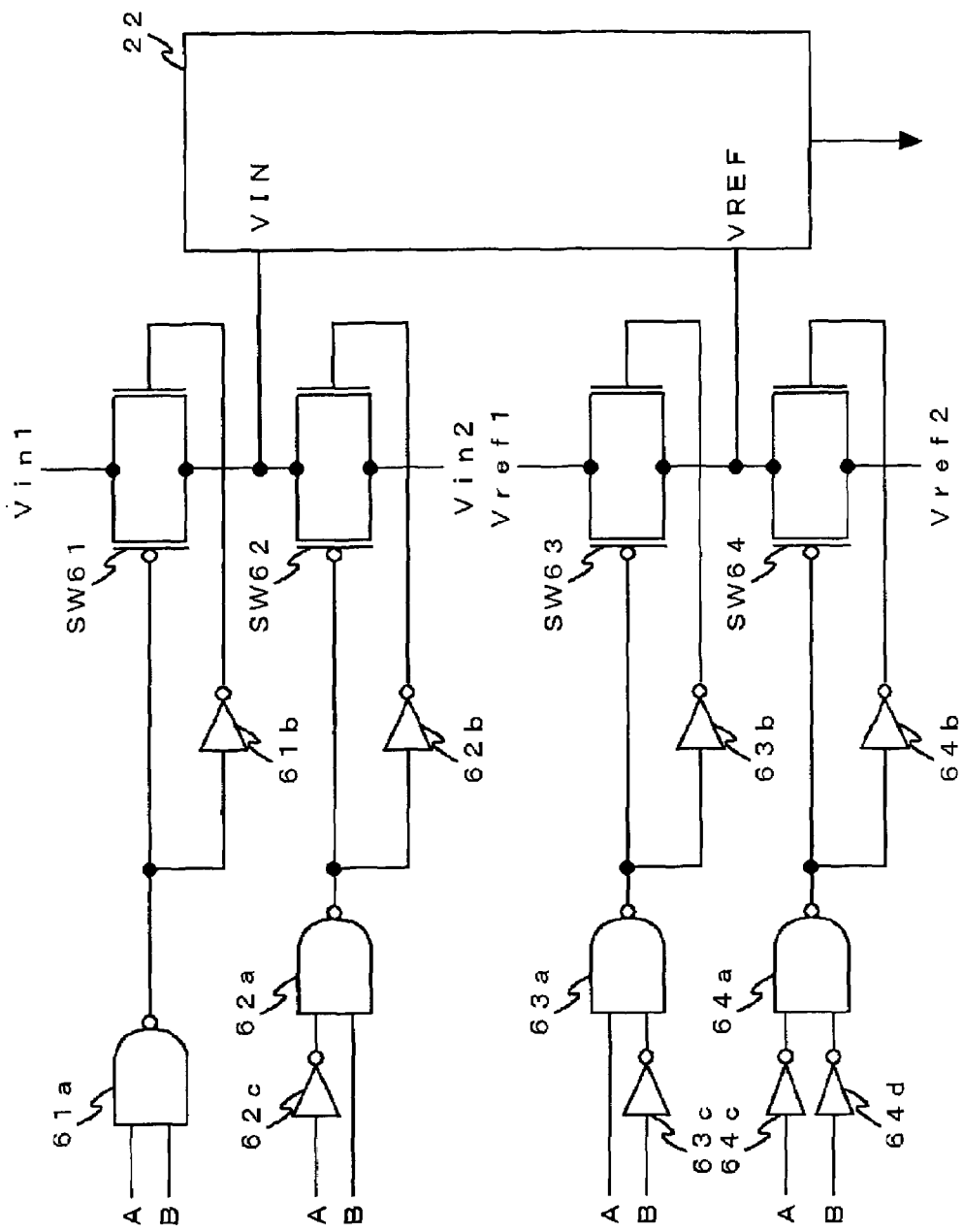
FIG. 5 illustrates a first example of structure of an input switching circuit according to the first embodiment.

A description will be given of switching control performed by the input switching circuit 26. FIG. 5 illustrates a first example of structure of the input switching circuit 26 according. The input switching circuit 26 feeds 4 voltages to an VIN input terminal and a VREF terminal of the first AD converter circuit 22. The input switching circuit 26 is provided with 4 switches SW61–SW64. The Vin1 switch SW61 is for connecting and disconnecting the input analog signal Vin1 to the VIN terminal, and is provided with a NOT circuit 61b for logical inversion. The Vin2 switch SW62 is for connecting and disconnecting the input analog signal Vin2 to the VIN terminal, and is provided with a NOT circuit 62b for logical inversion. The Vref1 switch SW63 is for connecting and disconnecting the first reference voltage Vref1 to the VREF terminal, and is provided with a NOT circuit 63b for logical inversion. The Vref2 switch SW64 is for connecting and disconnecting the second reference voltage Vref2 to the VREF terminal, and is provided with a NOT circuit 64b for logical inversion.

A NAND circuit 61a is connected to the Vin1 switch SW61. A NAND circuit 62a is connected to the Vin2 switch SW62, and a NOT circuit 62c is connected to a terminal of the NAND circuit 62a receiving a signal A. A NAND circuit 63a is connected to the Vref1 switch SW63, and a NOT circuit 63c is connected to a terminal of the NAND circuit 63a receiving a signal B. A NAND circuit 64a is connected to the Vref2 switch SW64, and NOT circuits 64c and 64d are connected to respective terminals of the NAND circuit 64a.

Figure 6:
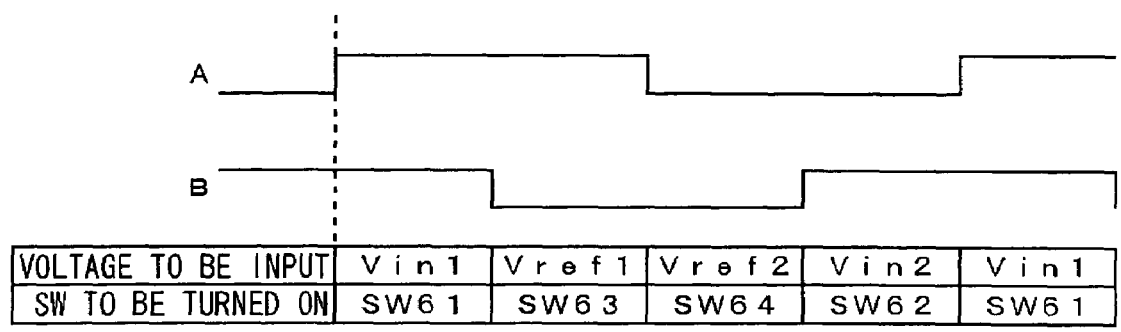
FIG. 6 illustrates a control signal in the first example of structure of the input switching circuit according to the first embodiment.

FIG. 6 illustrates a control signal in the first example of structure of the input switching circuit 26. When the signal A is high and the signal B is high, only the Vin1 switch SW61 is turned on so that the input analog signal Vin1 is fed to the VIN terminal. When the signal A is high and the signal B is low, only the Vref1 switch SW63 is turned on so that the first reference voltage Vref1 is fed to the VREF terminal. When the signal A is low and the signal B is low, only the Vref2 switch SW64 is turned on so that the second reference voltage Vref2 is fed to the VREF terminal. When the signal A is low and the signal B is high, only the Vin2 switch SW62 is turned on so that the input analog signal Vin2 is fed to the VIN terminal. The input switching circuit 26 feeds four voltages to the first AD converter circuit 22 in the stated order.

Figure 7:
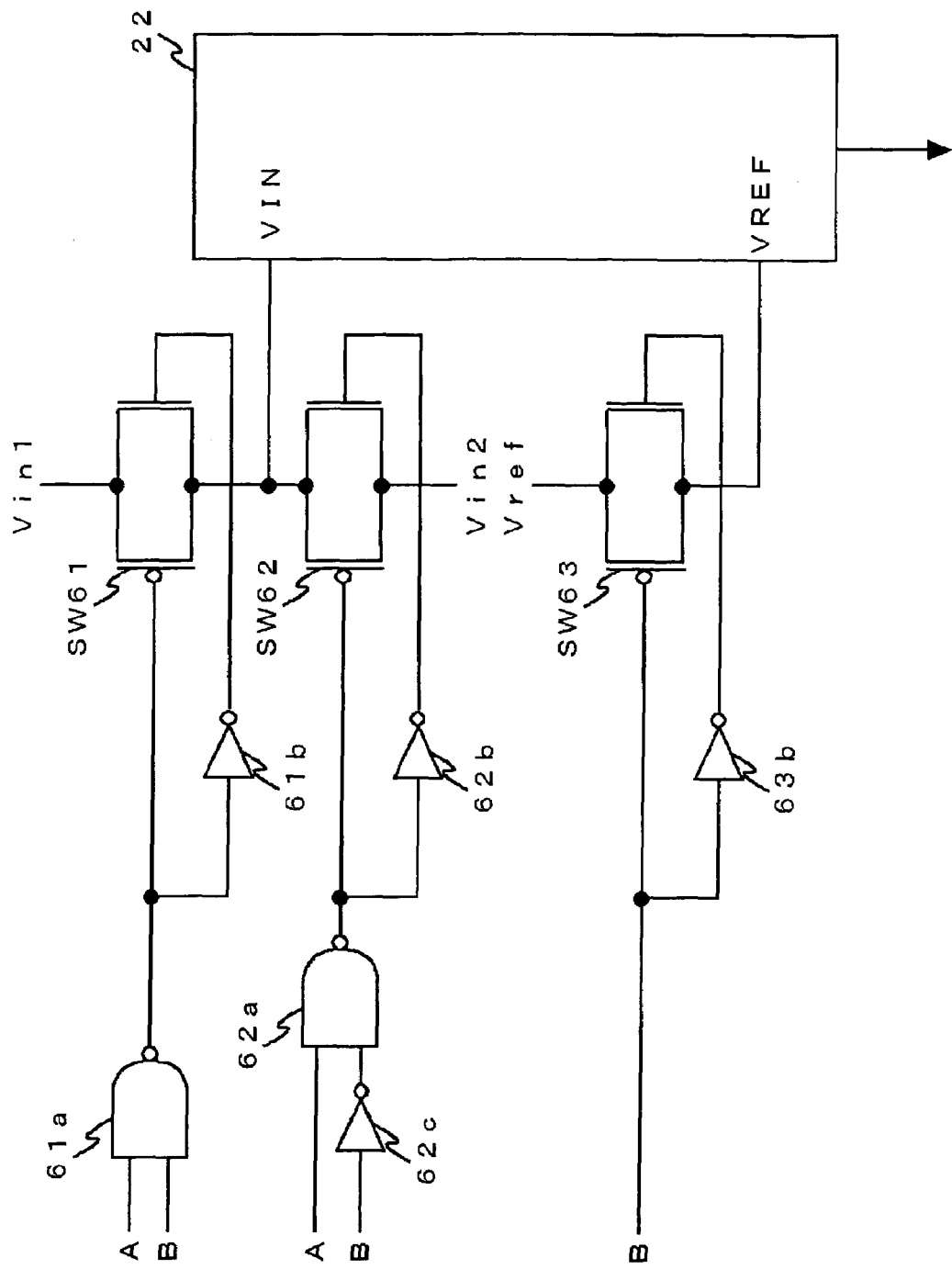
FIG. 7 illustrates a second example of structure of the input switching circuit according to the first embodiment.

A description will now be given of another mode of switching control performed by the input switching circuit 26. In this example, only one input reference voltage Vref is provided. By setting the gain of the fourth amplifier circuit 31 to 4, the same reference voltage Vref can continue to be used for conversion into the higher 4 bits (D9–D6) and that of the lower 2 bits (D1–D0). FIG. 7 illustrates a second example of structure of the input switching circuit 26. The input switching circuit 26 feeds 3 voltages to the VIN input terminal and the VREF terminal of the first AD converter circuit 22. The input switching circuit 26 is provided with 3 switches SW61–SW63. The Vin1 switch SW61 is for connecting and disconnecting the input analog signal Vin1 to the VIN terminal, and is provided with the NOT circuit 61b for logical inversion. The Vin2 switch SW62 is for connecting and disconnecting the input analog signal Vin2 to the VIN terminal, and is provided with the NOT circuit 62b for logical inversion.

The Vref switch SW63 is for connecting and disconnecting the reference voltage Vref to the VREF terminal, and is provided with the NOT circuit 63b for logical inversion.

The NAND circuit 61a is connected to the Vin1 switch SW61. The NAND circuit 62a is connected to the Vin2 switch SW62, and the NOT circuit 62c is connected to the terminal of the NAND circuit 62a receiving the signal B. An inversion of the signal B is fed to the Vref switch 63.

Figure 8:
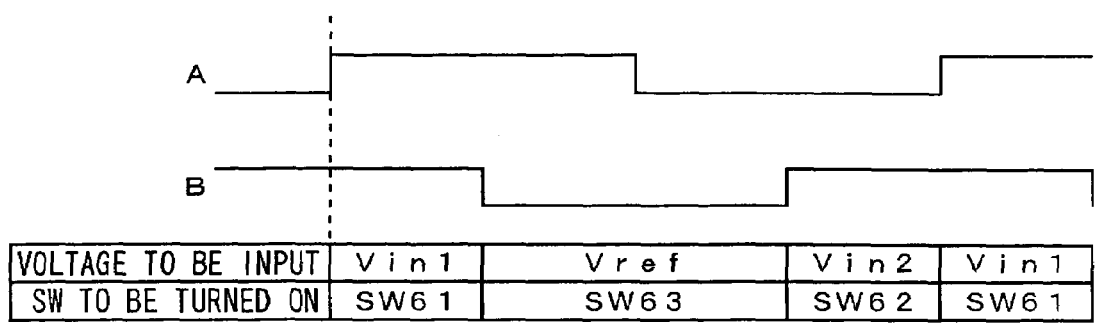
FIG. 8 illustrates a control signal in the second example of structure of the input switching circuit according to the first embodiment.

FIG. 8 illustrates a control signal in the second example of structure of the input switching circuit 26. When the signal A is high and the signal B is high, only the Vref1 switch SW61 is turned on so that the input analog signal Vin1 is fed to the VIN terminal. When the signal A is high and the signal B is low, and when the signal A is high and the signal B is low, only the Vref switch SW63 is turned on so that the reference voltage Vref is fed to the VREF terminal. When the signal A is low and the signal B is high, only the Vin2 switch SW62 is turned on so that the input analog voltage Vin2 is fed to the VIN terminal. The input switching circuit 26 feeds 3 voltages to the first AD converter circuit 22 in the stated order.

Figure 9:
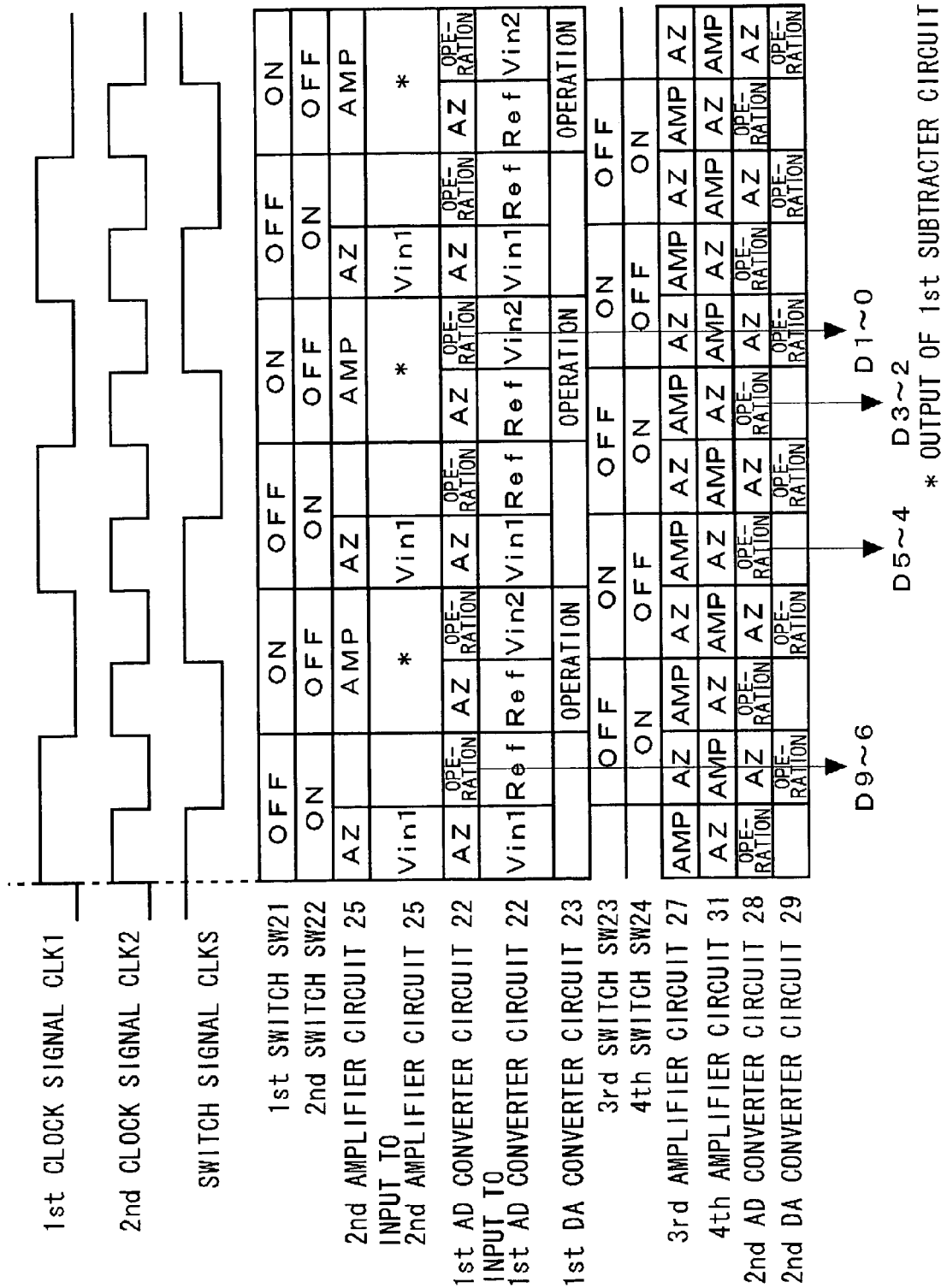
FIG. 9 is a timing chart illustrating the operation of the AD converter according to the example of the first embodiment.

A description will be given of the operation of the AD converter according to this example. FIG. 9 is a timing chart illustrating the operation of the AD converter according to this example. Three waveforms at the top are for a first clock signal CLK1, a second clock signal CLK2 and a switch signal CLKS in the illustrated order. The frequency of the second clock signal CLK2 is twice as high as that of the first clock signal CLK1.

The input analog signal Vin is sampled at a low-to-high rising edge of the first clock signal CLK1. When the first clock signal CLK1 and the second clock signal CLK2 are high, the second amplifier circuit 25 samples and holds the input analog signal Vin and is placed in an autozero operation mode during a half clock period. In a subsequent cycle of the second clock signal CLK2 marked by a transition to a high state, the second amplifier circuit 25 performs amplification. During this period of time, the output analog signal from the subtracter circuit 24 is fed to the second amplifier circuit 25.

The first AD converter circuit 22 is in an autozero operation mode when the second clock signal CLK2 is high and operates for conversion when the second clock signal CLK2 is low. The first AD converter circuit 22 outputs a digital value comprising D9–D6 when the second clock signal CLK2 is low in a first cycle and outputs a digital value comprising D1–D0 when the first clock signal CLK2 is low in the subsequent cycle. The input switching circuit 26 feeds the input analog signal Vin (denoted as Vin1 in the figure) when the second clock signal CLK2 is high in a first cycle, feeds the reference voltage Vref when the second clock signal is low in the subsequent cycle, feeds the reference voltage Vref when the second clock signal is high in the subsequent cycle, and feeds the output analog signal (denoted as Vin2 in the figure) from the fourth amplifier circuit 31 when the second clock signal is low in the subsequent cycle. When the two reference voltages Vref1 and Vref2 are used, the voltages continue to be used in the order of Vref1, Vref1, Vref2 and Vref2 throughout the cycles. The first DA converter circuit 23 operates for conversion while the first clock signal CLK1 is low and outputs a result to the first subtracter circuit 24. When the first clock signal CLK1 is high, the first DA converter circuit 23 is an undefined state.

The third amplifier circuit 27 amplifies the sampled analog signal when the second clock signal CLK2 is low and is placed in an autozero operation mode when the second clock signal CLK2 is low. The fourth amplifier circuit 31 amplifies an output of the second subtracter circuit 30 when the second clock signal CLK2 is low and is placed in an autozero operation mode when the second clock signal CLK2 is high. The second AD converter circuit 28 operates for conversion when the second clock signal CLK2 is high and is placed in an autozero operation mode when the second clock signal CLK2 is low. The second DA converter circuit 29 operates for conversion when the second clock signal CLK2 is low and is in an undefined state when the second clock signal CLK2 is high.

The first switch SW21 is turned on when the first clock signal CLK1 is low and turned off when the first clock signal CLK1 is high. The second switch SW22 is turned on when the first clock signal CLK1 is high and turned off when the first clock signal CLK1 is low. The third switch SW23 is turned on when the switch signal CLKS is high and turned off when the switch signal CLKS is low. The fourth switch SW24 is turned on when the switch signal CLKS is low and turned off when the switch signal CLKS is high.

In contrast, when the input switching circuit 26 feeds the voltages in the order of Vref1–>Vref1–>Vref2–>Vref2 to the first AD converter circuit 22, the period of time that can be consumed by the voltage comparison elements constituting the first AD converter circuit 22 is shortened, as described in the comparative example illustrated in FIG. 3. Also, a complicated arrangement for clock signals will be required.

With the benefit from the pipeline process as described above, the AD converter as a whole is capable of outputting a digital value of 10 bits once in a cycle defined by the first clock signal CLK1.

Given above is a description of the first embodiment based on the example. The description of the embodiment is illustrative in nature and various variations in constituting elements and processes involved are possible. Those skilled in the art would readily appreciate that the variations are also within the scope of the first embodiment.

Parameters such as the number of bits produced as a result of conversion in the AD converter circuit, allocation of conversion bits, and the gain of the amplifier circuits given in the description above of the example of the first embodiment are merely by way of example. Other parameter values may be employed in variations.

The first embodiment is not only applicable to a time-shared AD conversion part in a pipeline or cyclic AD converter, but also to a time-shared AD conversion part in an AD converter other that that of a pipeline type or a cyclic type.

(Second Embodiment)

The art related to the second embodiment will be discussed below. In recent years, a variety of additional functions are built in mobile appliances such as a mobile telephone set, including the image pick-up function, the image playback function, the moving image pick-up function and the moving image playback function. In association with this, there is an increasing demand for miniaturization and power saving of an analog-digital converter (hereinafter, referred to as an AD converter). One mode of AD converter that addresses this demand is known as a cyclic AD converter which cycles through stages (see, for example, the patent document No. 1). The patent document No. 1 discloses an AD converter of a pipeline type comprising two stages that include an AD conversion part of a cyclic type.

In the first stage of the AD converter illustrated in FIG. 1 of the patent document No. 1, the sample and hold circuit S/H1 is provided parallel with a system comprising the parallel A/D converter AD1 and the D/A converter DA1. The analog signal input to this circuit is held by the sample and hold circuit S/H1 for a predetermined period of time.

Since the sample and hold circuit includes an operational amplifier, the output voltage range of the sample and hold circuit tends to be limited in a low voltage operation. Degradation in characteristics, such as distortion, caused by less extensive output voltage of the sample and hold circuit in a low voltage operation presents a serious disadvantage particularly in the first stage with the severest requirement for precision. As a result, the characteristics of the AD converter as a whole become poor.

The second embodiment will be summarized as follows. The second embodiment has been developed in view of the aforementioned circumstances and its object is to improve the characteristics of a pipeline line or cyclic AD converter in a low voltage operation.

The second embodiment according to one aspect provides an analog-digital converter. The analog-digital converter according to this aspect is an analog-digital converter converting an input analog signal into a digital value in discrete steps, comprising: a plurality of stages each converting an input analog signal into a digital value of a predetermined number of bits, wherein at least one of the plurality of stages is a stage amplifying an analog signal input to the stage by an amplifier element, the amplifier element being a first subtracting amplifier circuit which samples and holds the analog signal input to the stage, subtracts a signal derived by conversion from the digital value, obtained by analog-to-digital conversion in the stage, into an analog signal, from the analog signal thus held, and amplifies a result of subtraction, at least one other of the plurality of stages is a stage amplifying the analog signal input to the stage by a plurality of amplifier elements, one of the plurality of amplifier elements being a sample and hold circuit which samples and holds the analog signal input to the stage, or an amplifier circuit which samples the analog signal input to the stage and amplifies the sampled signal by a predetermined gain, and each of the others of the plurality of amplifier elements being a second subtracting amplifier circuit which subtracts a signal derived by conversion from the digital value, obtained by analog-to-digital conversion in the stage, into an analog signal, from an output analog signal from the sample and hold circuit or the amplifier circuit, and which amplifies a result of subtraction.

According to this aspect, a stage is introduced in which the subtracting amplifier circuit samples and holds the input, and in which the sample and hold circuit, provided according to the related art so as to be parallel with the AD converter circuit, is eliminated. With this, degradation in characteristics occurring in the sample and hold circuit is eliminated so that the characteristics of the AD converter as a whole is improved. Since a sample and hold circuit degrades a signal outside an output range, the elimination results in improvement in the characteristics in a low voltage operation. The phrase "amplifier element" refers to an element amplifying by a gain of 1, i.e. a sample and hold circuit.

The first subtracting amplifier circuit may directly sample an analog signal input to a stage in which is included the first subtracting amplifier circuit, according to the same timing schedule in which the analog signal is sampled in that stage for conversion into a digital value. With this, a signal component that results from conversion in that stage is eliminated without an error, even when the related-art sample and hold circuit is eliminated.

The stage including the first subtracting amplifier circuit may be a first stage. With this, degradation in characteristics, occurring according to the related art in the sample and hold circuit in the first sage handling a relatively large signal, is eliminated so that the characteristics of the AD converter as a whole are improved.

The arbitrary stage selected from the plurality of stages may be a cyclic stage which feeds an output analog signal from that stage back to the input thereof. By introducing a cyclic stage, the circuit area is reduced.

The first subtracting amplifier circuit may hold the sampled input analog signal until the conversion of the digital value, resulting from the analog-to-digital conversion in that stage, into an analog value is completed. With this, it is ensured that subtraction and amplification are performed on analog signals derived from the same sampling.

The first subtracting amplifier circuit may amplify in a period of time longer than the autozero period. By extending the period of time for amplification, a settling time is secured so that amplification by a large factor may be performed.

Arbitrary combinations of the aforementioned constituting elements, and implementations of the second embodiment in the form of methods, apparatus and systems may also be practiced as additional modes of the second embodiment.

(First Example of the Second Embodiment)

A first example of the second embodiment provides an AD converter in which, an AD converter circuit in the first stage converts into 4 bits and an AD converter circuit of a cyclic type in the second stage converts into 3 bits in each of 2 cycles, thus outputting a total of 10 bits.

Figure 10:
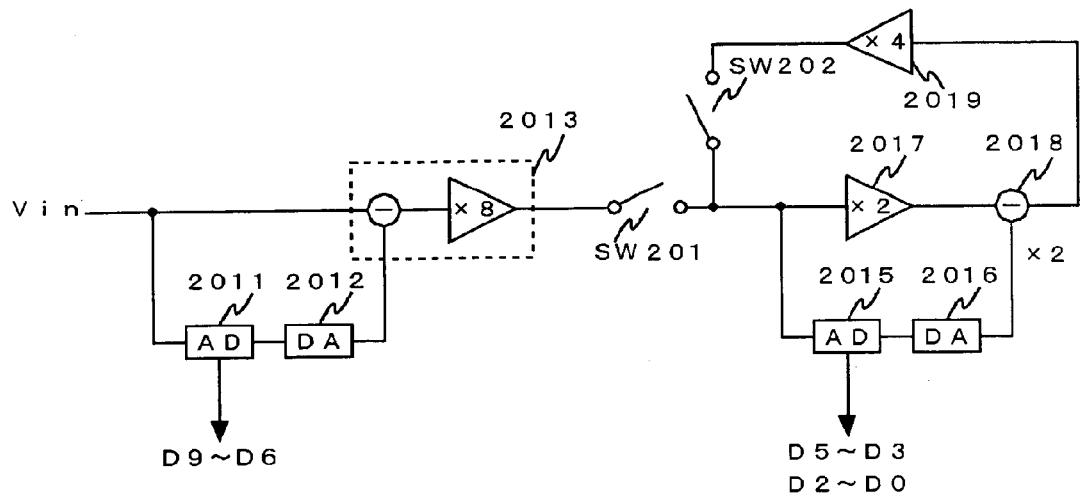
FIG. 10 illustrates the structure of an AD converter according to a second example of a second embodiment of the present invention.

FIG. 10 illustrates the structure of an AD converter according to the first example. At an initial stage, a first switch SW201 is turned on and a second switch SW202 is turned off. In this AD converter, the input analog signal Vin is fed to a subtracting amplifier circuit 2013 and a first AD converter circuit 2011. The first AD converter circuit 2011 converts the input analog signal into a digital value so as to retrieve the higher 4 bits (D9–D6). The AD converter circuit 2011 may be of a flash type for high-speed conversion. The first DA converter circuit 2012 converts the digital value produced by conversion by the first AD converter circuit 2011 into an analog value. The subtracting amplifier circuit 2013 samples the input analog signal Vin in synchronization with the sampling by the first AD converter circuit 2011, holds the analog signal Vin for a predetermined period of time, subtracts an output analog signal from the first DA converter circuit 2012 from the analog signal thus held, and amplifies a result of subtraction by a factor of 8. The predetermined period of time is at least longer than the period of time required to complete the conversion by the first DA converter circuit 2012.

The analog signal input via the first switch SW201 is fed to a second amplifier circuit 2017 and a second AD converter circuit 2015. The second AD converter circuit 2015 converts the input analog signal into a digital value so as to retrieve the 5th through 7th highest bits (D8–D6). The second DA converter circuit 2016 converts the digital value produced by conversion by the second AD converter circuit 2015 into an analog value.

The second amplifier circuit 2017 amplifies the input analog signal by a factor of 2 and outputs the amplified signal to a second subtracting circuit 2018. The second amplifier circuit 2018 subtracts an output of the second DA converter circuit 2016 from an output of the second amplifier circuit 2017. The output of the second DA converter circuit 2016 is amplified by a factor of 2.

A description will now be given of a method of amplifying the output of the second DA converter 2016 by a factor of 2. A higher reference voltage VRT and a lower reference voltage VRB are supplied to the second AD converter circuit 2015 and the second DA converter circuit 2016 to generate a reference voltage range. The second AD converter circuit 2015 uses the reference voltage range to generate a reference voltage for a plurality of voltage comparison elements (not shown). The second DA converter circuit 2016 obtains an output voltage by selectively supplying the higher reference voltage VRT and the lower reference voltage VRB to each of a plurality of capacitors (not shown) under the control of the second AD converter circuit 2015. The reference voltage range of the second AD converter circuit 2015 and the reference voltage range of the second DA converter circuit 2016 may be set to a ratio of 1:2.

A third amplifier circuit 2019 amplifies the output of the second subtracter circuit 2018 by a factor of 4. At this point of time, the first switch SW201 is turned off and the second switch SW202 has made a transition to an on state. The output analog signal from the third amplifier circuit 2019 is fed back to the second amplifier circuit 2017 and the second AD converter circuit 2015 via the second switch SW202. In a similar configuration as the first stage, a subtracting amplifier circuit may be used instead of the second subtracter circuit 2018 and the third amplifier circuit 2019. In this way, the circuit is simplified. The process described above is repeated so that the second AD converter circuit 2015 retrieves the 8th through 10th highest bits (D2–D0). With this, a 10-bit digital value is obtained. The 5th through 10th highest bits (D5–D0) are obtained by a cyclic configuration.

In the description given above, it is assumed that the gain of the second amplifier circuit 2017 is 2, and the gain of the third amplifier circuit 1209 is 4. Alternatively, the second amplifier circuit 2017 may be configured as a sample and hold circuit with a gain of 1, and the gain of the third amplifier circuit 2019 may be 8. The requirement is that the analog signal is amplified by a factor of 8 before being subjected to conversion by the second AD converter circuit 2015.

Figure 11:
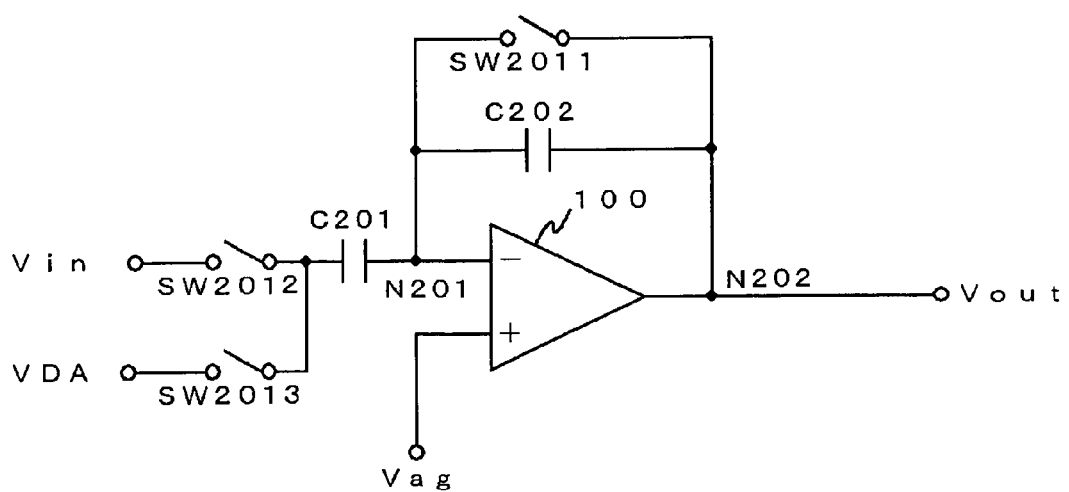
FIG. 11 illustrates the structure of a subtracting amplifier circuit according to the second embodiment.
Figure 12:
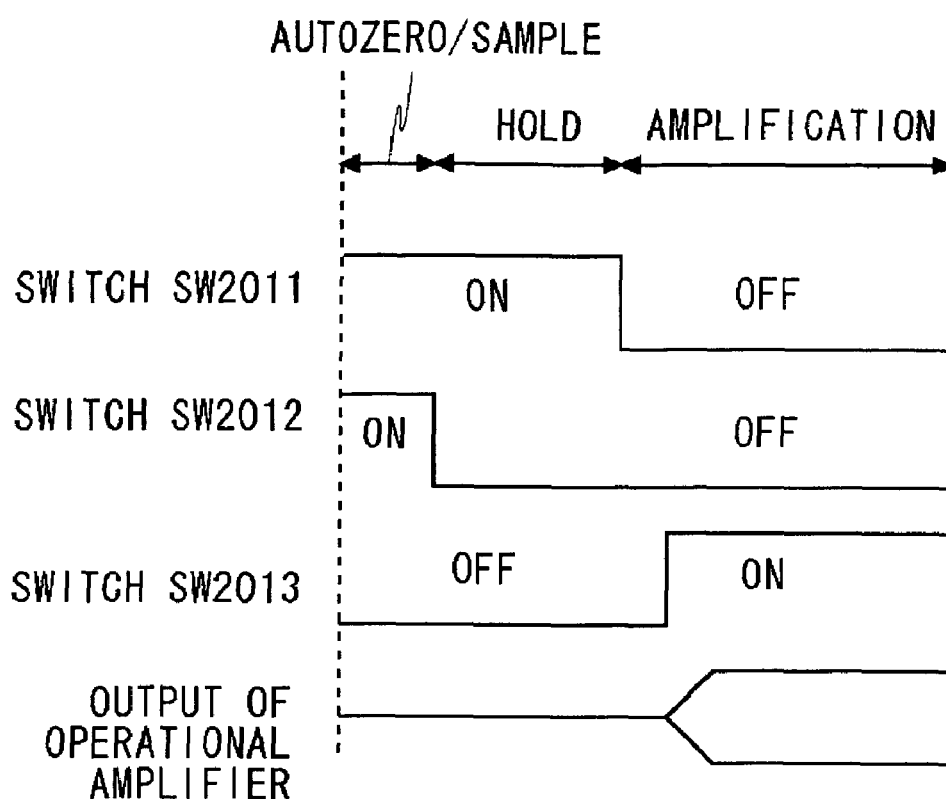
FIG. 12 is a timing chart illustrating the operation of the subtracting amplifier circuit according to the second embodiment.

FIG. 11 illustrates the structure in which the subtracting amplifier circuit 2013 is embodied by a single-ended switched capacitor operational amplifier. FIG. 12 is a timing chart illustrating the operation of the subtracting amplifier circuit 2013. Referring to FIG. 11, an input capacitor C201 is connected to the inverting input terminal of an operational amplifier 20100. An input analog signal Vin1 is fed to the terminal via a Vin1 switch SW2012, and an output analog signal VDA from the first Da converter circuit 2012 is fed thereto via a VDA switch SW2013. The non-inverting input terminal of the operational amplifier 20100 is connected to an autozero potential. The output terminal and the inverting input terminal of the operational amplifier 20100 are connected to each other via a feedback capacitor C202. An autozero switch SW2011 is connected across the feedback capacitor C202 to enable short circuit between the output terminal and the inverting input terminal of the operational amplifier 20100.

A description will now be given of the operation of the subtracting amplifier circuit 2013 illustrated in FIG. 11 by referring to FIG. 12. In order to apply an autozero potential Vag, the autozero switch SW2011 is turned on. In this state, an input node N201 and an output node N202 are both at the autozero potential Vag. In order to sample the input voltage Vin1, the Vin1 switch SW2012 is turned on and the VDA switch SW2013 is turned off. At this point of time, the charge QA at the input node N201 is given by the following equation (A1).

$$QA = C201(Vin1 - Vag) \quad (A1)$$

Subsequently, in order to hold the voltage fed to the input of the input capacitor C201 at the end of the autozero period, i.e., the input analog signal sampled by the input capacitor C201, the Vin switch SW2012 is turned off. When the conversion by the first DA converter circuit 2012 is completed, the autozero switch SW2011 is turned off in order to enable imaginary ground of the operational amplifier circuit 20100 and amplification thereby. Subsequently, in order to effect subtraction of the output analog signal VDA from the first DA converter circuit 2012, the VDA switch SW2013 is turned on. At this point of time, the charge QB at the input node N201 is given by the following equation (A2).

$$QB = C201(VDA - Vag) + C202(Vout - Vag) \quad (A2)$$

Since there are no routes for the charge to be dissipated through the input node N201, the principle of conservation of charge demands QA=QB, so that the following equation (A3) holds.

$$Vout = C201/C202(Vin1 - VDA) + Vag \quad (A3)$$

Accordingly, given that the autozero potential Vag is an ideal ground potential, the single-ended switched capacitor operational amplifier is capable of amplifying a difference between the input voltage Vin1 and the output analog signal from the first DA converter circuit 2012 according to the capacitance ratio between the input capacitor C201 and the feedback capacitor C202. Even if the autozero potential Vag is not an ideal ground potential, an approximation can be obtained. Described above is an example using the single-ended switched capacitor operational amplifier. Alternatively, a fully-differential switched capacitor operational amplifier may be used.

Figure 13:
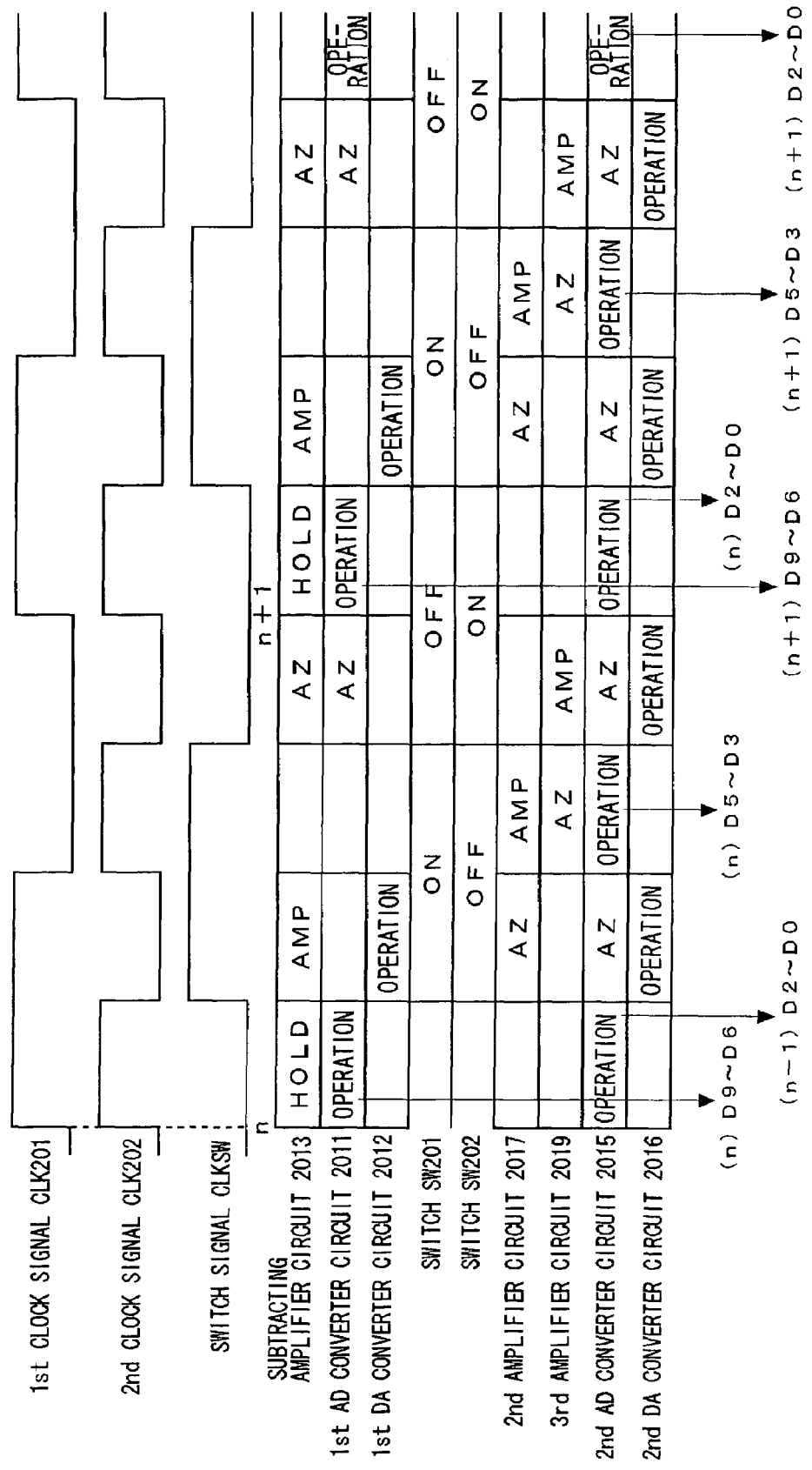
FIG. 13 is a timing chart illustrating a first example of operation of an AD converter according to a first example of the second embodiment.

FIG. 13 is a timing chart illustrating a first example of operation of an AD converter according to a first example of the second embodiment. The operation will be described from the first step downward in the figure. Three waveforms at the top are for a first clock signal CLK1, a second clock signal CLK2 and a switch signal CLKSW in the illustrated order. The frequency of the second clock signal CLK2 is twice as high as that of the first clock signal CLK1.

The subtracting amplifier 2013 and the first AD converter circuit 2011 sample the input analog signal Vin at a low-to-high rising edge of the first clock signal CLK1. The subtracting amplifier circuit 2013 holds the sampled input analog signal Vin when the second clock signal CLK2, whose rising edge is synchronized with the rising edge of the first clock signal CLK1, is high. While the second clock signal CLK2 remains low in the current cycle defined by the first clock CLK1, the subtracting amplifier circuit 2013 performs subtraction and amplification. When the second clock CLK2 is low in the subsequent cycle, the subtracting amplifier circuit 2013 is placed in an autozero operation mode. The first AD converter circuit 2011 operates for conversion when the second clock signal, whose rising edge is synchronized with the rising edge of the first clock signal CLK1, is high so as to output a digital value comprising D9–D6. When the second clock signal CLK2 is low in the previous cycle, the first AD converter circuit 2011 is placed in an autozero operation mode. The first DA converter circuit 2012 is in an undefined state when the second clock signal CLK2, whose rising edge is synchronized with the rising edge of the first clock signal CLK1, is high. The first DA converter circuit 2012 holds the data subjected to DA conversion while the second clock signal CLK2 remains low in the current cycle.

The first switch SW201 is turned on when the switch signal CLKSW is low and turned off when the switch signal CLKSW is high. The second switch SW202 is turned on when the switch signal CLKSW is high and turned off when the switch signal CLKSW is low. The second amplifier circuit 2017 samples the input analog signal at a low-to-high rising edge of the second clock signal CLK2 while the switch signal CLKSW is high. The second amplifier circuit 2017 amplifies the analog signal while the second clock signal CLK2 remains low immediately after the sampling, and is placed in an autozero operation mode when the second clock signal CLK2 is high in the cycle immediately preceding the sampling. The third amplifier circuit 2019 samples the input analog signal at a high-to-low falling edge of the second clock signal CLK2 synchronized with the falling edge of the switch signal CLKSW. The third amplifier circuit 2019 amplifies the analog signal while the second clock signal CLK2 remains low immediately after the sampling, and is placed in an autozero operation mode when the second clock signal CLK2 is high in the cycle immediately preceding the sampling. The second AD converter circuit 2015 samples the input analog signal at a low-to-high rising edge of the second clock signal CLK2. The second AD converter circuit 2015 operates for conversion when the second clock signal CLK2 is high and is placed in an autozero operation mode when the second clock signal CLK2 is low. The second DA converter circuit 2016 holds data subjected to DA conversion while the second clock signal CLK2 is low and is in an undefined state when the second clock signal CLK2 is high.

As shown, while the first AD converter circuit 2011 is converting into D9–D6, the second AD converter circuit 2015 is concurrently converting into D2–D0 from the previous input. According to the pipeline process as described above, the AD converter as a whole is capable of outputting a digital value of 10 bits once in a cycle defined by the first clock signal CLK1.

Figure 14:
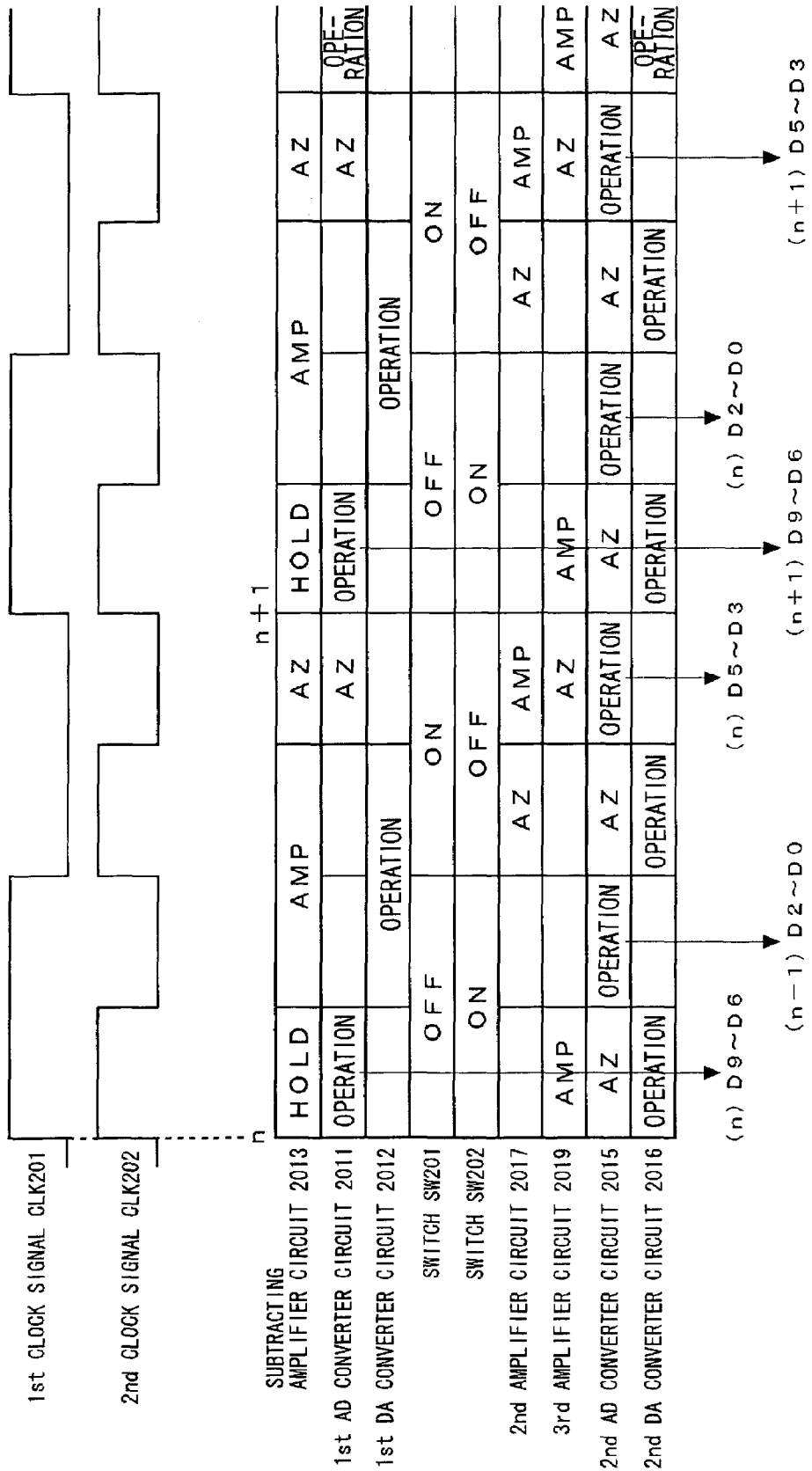
FIG. 14 is a timing chart illustrating a second example of operation of an AD converter according to the first example of the second embodiment.

FIG. 14 is a timing chart illustrating a second example of operation of the AD converter according to the first example of the second embodiment. In the second example of operation, it is ensured that the period of time for amplification in the subtracting amplifier circuit 2013 is longer than in the first example of operation. The process will be described from the first step downward in the figure. Two waveforms at the top are for a first clock signal CLK1 and a second clock signal CLK2. The frequency of the second clock signal CLK2 is twice as high as that of the first clock signal CLK1.

The subtracting amplifier 2013 and the first AD converter circuit 2011 sample the input analog signal Vin at a low-to-high rising edge of the first clock signal CLK1. The subtracting amplifier circuit 2013 holds the sampled input analog signal Vin when the second clock signal CLK2, whose rising edge is synchronized with the rising edge of the first clock signal CLK1, is high. While the second clock signal CLK2 remains low in the current cycle defined by the first clock CLK1 and high in the subsequent cycle, the subtracting amplifier circuit 2013 performs subtraction and amplification. When the second clock CLK2 is low in the subsequent cycle, the subtracting amplifier circuit 2013 is placed in an autozero operation mode. The first AD converter circuit 2011 operates for conversion when the second clock signal, whose rising edge is synchronized with the rising edge of the first clock signal CLK1, is high so as to output a digital value comprising D9–D6. When the first clock signal CLK1 is low and the second clock CLK2 is low, the first AD converter circuit 2011 is placed in an autozero operation mode. The first DA converter circuit 2012 is in an undefined state when the second clock signal CLK2, whose rising edge is synchronized with the rising edge of the first clock signal CLK1, is high. The first DA converter circuit 2012 holds the data subjected to DA conversion while the second clock signal CLK2 remains low in the current cycle and high in the subsequent cycle.

The first switch SW201 is turned on when the first clock signal CLK1 is low and turned off when the first clock signal CLK1 is high. The second switch SW202 is turned on when the first clock signal CLK1 is high and turned off when the first clock signal CLK1 is low. The second amplifier circuit 2017 samples the input analog signal at a high-to-low falling edge of the second clock signal CLK2 while the first clock signal CLK1 is low. The second amplifier circuit 2017 amplifies the analog signal when the second clock signal CLK2 remains low immediately after the sampling, and is placed in an autozero operation mode when the second clock signal CLK2 is high in the cycle immediately preceding the sampling. The third amplifier circuit 2019 samples the input analog signal at a low-to-high rising edge of the second clock signal CLK2 synchronized with the rising edge of the first clock signal CLK1. The third amplifier circuit 2019 amplifies the analog signal when the second clock signal CLK2 remains high immediately after the sampling, and is placed in an autozero operation mode when the second clock signal CLK2 is low in the cycle immediately preceding the sampling. The second AD converter circuit 2015 samples the input analog signal at a high-to-low falling edge of the second clock signal CLK2. The second AD converter circuit 2015 operates for conversion when the second clock signal CLK2 is low and is placed in an autozero operation mode when the second clock signal CLK2 is high. The second DA converter circuit 2016 holds data subjected to DA conversion when the second clock signal CLK2 is high and is in an undefined state when the second clock signal CLK2 is low.

As shown, while the first AD converter circuit 2011 is converting into D9–D6, the second AD converter circuit 2015 is concurrently converting into D2–D0 from the previous input. According to the pipeline process as described above, the AD converter as a whole is capable of outputting a digital value of 10 bits once in a cycle defined by the first clock signal CLK1.

According to the second example of operation, it is ensured that the period of time for subtraction and amplification by the subtracting amplifier circuit 2013 is longer than that of the first example of operation. When a high gain of, for example, 8 is required such as in the case of the subtracting amplifier circuit 2013 of FIG. 10, the required setting time is relatively long. In this case, for example, the timing schedule in the second example of operation may be observed. When a high gain is not required of the subtracting amplifier circuit 2013, the required settling time is relatively short so that the timing schedule in the first example serves the purpose. Thus, according to the first example of the second embodiment, a sample and hold circuit, provided according to the related art so as to be parallel with the AD converter circuit 2011 of the first stage, is eliminated in a pipeline AD converter comprising two stages that include a cyclic AD conversion part. With this, the characteristics of the AD converter are improved. Particularly, the linear characteristics are improved. Accordingly, the use of a low voltage input is facilitated. Further, circuit area and power consumption are reduced.

(Second Example of the Second Embodiment)

The second example of the second embodiment provides an AD converter of a pipeline type comprising three stages, in which the AD converter circuit in the first stage converts into 4 bits, the AD converter circuit in the second stage converts into 3 bits, and the AD converter circuit in the third stage converts into 3 bits.

Figure 15:
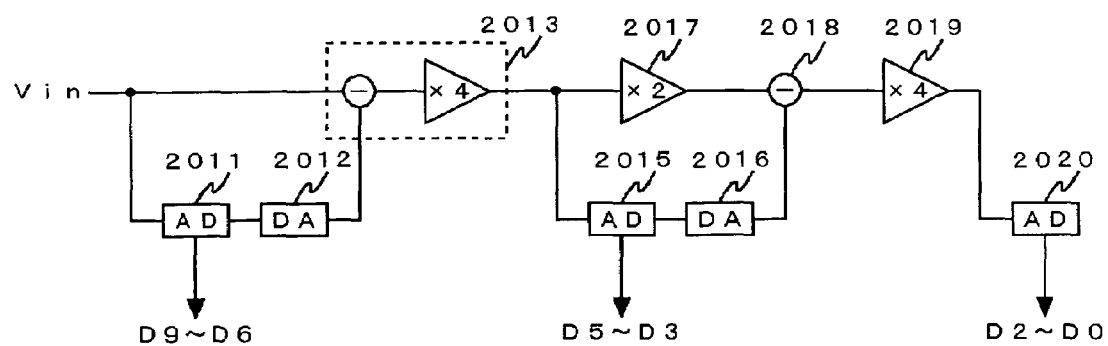
FIG. 15 illustrates the structure of the AD converter according to the second example of the second embodiment.

FIG. 15 illustrates the structure of the AD converter according to the second example. In this AD converter, the input analog signal Vin is fed to the subtracting amplifier circuit 2013 and the first AD converter circuit 2011. The first AD converter circuit 2011 converts the input analog signal into a digital value so as to retrieve the higher 4 bits (D9–D6). The first DA converter circuit 2012 converts the digital value produced by conversion by the first AD converter circuit 2011 into an analog value. The subtracting amplifier circuit 2013 samples the input analog signal Vin in synchronization with the sampling by the first AD converter circuit 2011, holds the analog signal Vin for a predetermined period of time, subtracts an output analog signal from the first DA converter circuit 2012 from the analog signal thus held, and amplifies a result of subtraction by a factor of 4. The predetermined period of time is longer than the period of time required to complete the conversion by the first DA converter circuit 2012.

The analog output signal input via the first switch SW201 is fed to the second amplifier circuit 2017 and the second AD converter circuit 2015. The second AD converter circuit 2015 converts the input analog signal into a digital value so as to retrieve the 5th through 7th highest bits (D5–D3). The reference voltage supplied to the voltage comparison elements constituting the second AD converter circuit 4027 is set to 1/2 of the reference voltage supplied to a voltage comparison element constituting the first AD converter circuit 4012. Since the second AD converter circuit 2015 is tasked with converting into 3 bits, the subtracting amplifier circuit 2013 should amplify by a factor of 8 (2 raised to the 3rd power). By setting the reference voltage ratio to 1/2 as mentioned above, the gain of the subtracting amplifier circuit 2013 will be 4. The second DA converter circuit 2016 converts the digital value produced by conversion by the second AD converter circuit 2015 into an analog value. The second amplifier circuit 2017 amplifies the input analog signal by a factor of 2 and outputs the amplified signal to the second subtracter circuit 2018. The second subtracting amplifier circuit 2018 subtracts an output of the second DA converter circuit 2016 from an output of the second amplifier circuit 2017. The output of the second DA converter circuit 2016 is amplified by 2 times.

The third amplifier circuit 2019 amplifies the output of the second subtracter circuit 2018 by a factor of 4. An output analog signal from the third amplifier circuit 2019 is fed to a third AD converter circuit 2020. The third AD converter circuit 2020 converts the input analog signal into a digital value so as to retrieve the 8th through 10th highest bits (D2–D0). With this, a 10-bit digital value is obtained in three stages.

Figure 16:
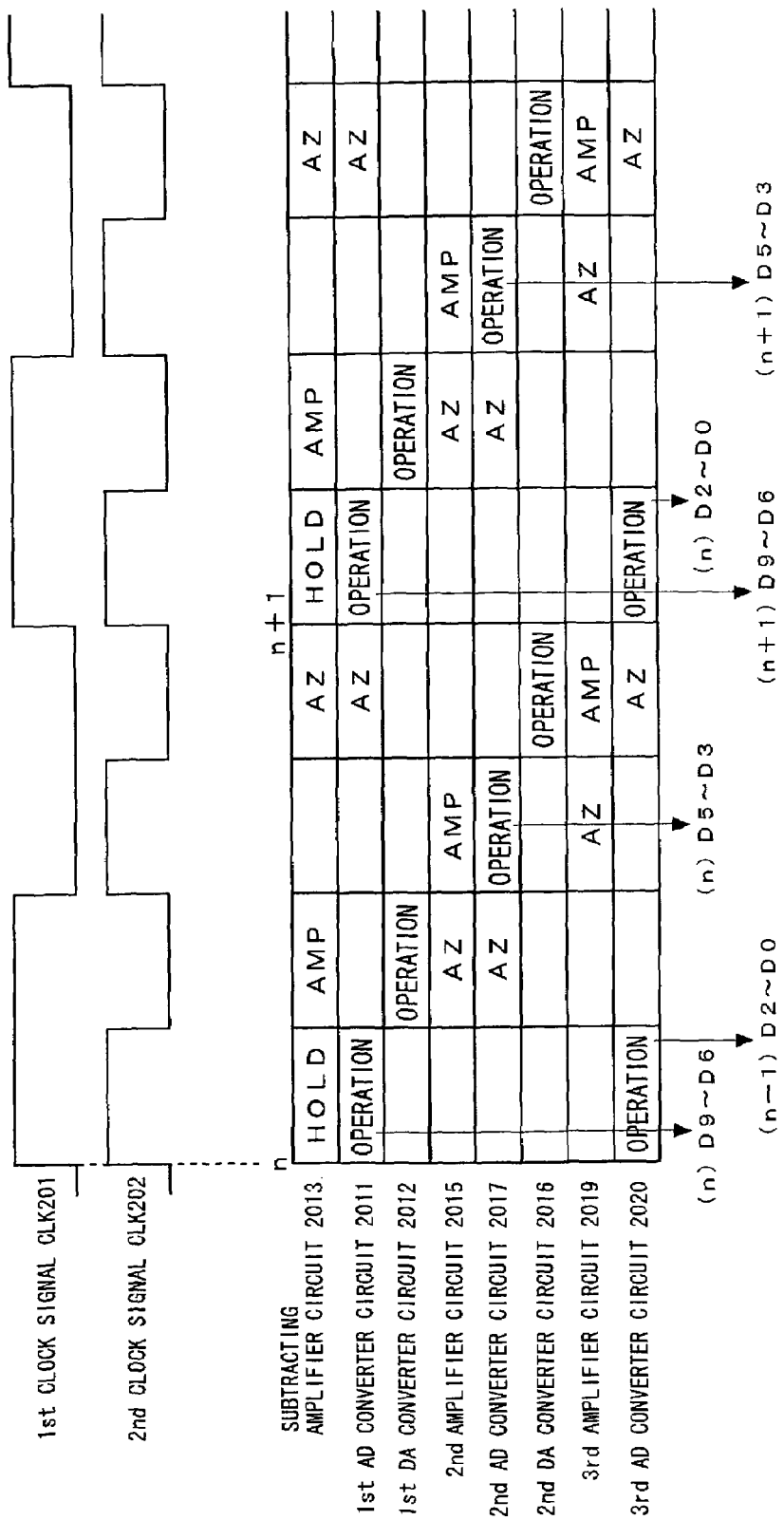
FIG. 16 is a timing chart illustrating an example of operation of the AD converter according to the second example of the second embodiment.

FIG. 16 is a timing chart illustrating an example of operation of the AD converter according to the second example. The process will be described from the first step downward in the figure. Two waveforms at the top are for a first clock signal CLK1 and a second clock signal CLK2. The frequency of the second clock signal CLK2 is twice as high as that of the first clock signal CLK1.

The subtracting amplifier 2013 and the first AD converter circuit 2011 sample the input analog signal Vin at a low-to-high rising edge of the first clock signal CLK1. The subtracting amplifier circuit 2013 holds the sampled input analog signal Vin when the second clock signal CLK2, whose rising edge is synchronized with the rising edge of the first clock signal CLK1, is high. While the second clock signal CLK2 is low in the current cycle defined by the first clock CLK1, the subtracting amplifier circuit 2013 performs subtraction and amplification. When the second clock CLK2 is low in the subsequent cycle, the subtracting amplifier circuit 2013 is placed in an autozero operation mode. The first AD converter circuit 2011 operates for conversion when the second clock signal, whose rising edge is synchronized with the rising edge of the first clock signal CLK1, is high so as to output a digital value comprising D9–D6. When the second clock signal CLK2 is low in the previous cycle, the first AD converter circuit 2011 is placed in an autozero operation mode. The first DA converter circuit 2012 is in an unstable state when the second clock signal CLK2, whose rising edge is synchronized with the rising edge of the first clock signal CLK1, is high. The first DA converter circuit 2012 holds the data subjected to DA conversion when the second clock signal CLK2 is low in the current cycle.

The second amplifier circuit 2017 samples the input analog signal at a low-to-high rising edge of the second clock signal CLK2 synchronized with the falling edge of the first clock signal CLK1. The second amplifier circuit 2017 amplifies the analog signal when the second clock signal CLK2 remains low immediately after the sampling, and is placed in an autozero operation mode when the second clock signal CLK2 is low in the cycle immediately preceding the sampling. The second AD converter circuit 2015 operates for conversion when the second clock signal CLK2 remains high immediately after the sampling and is placed in an autozero operation mode when the second clock signal CLK2 is low in the cycle immediately preceding the sampling. The second DA converter circuit 2016 holds the digital-to-analog converted data when the second clock signal CLK2 is low in a period when the first clock signal is low, and is in an undefined state when the second clock signal CLK2 is high. The third amplifier circuit 2019 samples the input analog signal at a high-to-low falling edge of the second clock signal CLK2 in a period when the first clock signal CLK1 is low. The third amplifier circuit 2019 amplifies the analog signal when the second clock signal CLK2 remains low immediately after the sampling, and is placed in an autozero operation mode when the second clock signal CLK2 is high in the cycle immediately preceding the sampling. The third AD converter circuit 2020 samples the input analog signal Vin at a low-to-high rising edge of the first clock signal CLK1. The third AD converter circuit 2020 operates for conversion when the second clock signal CLK2 remains high immediately after the sampling and is placed in an autozero operation mode when the second clock signal CLK2 is low in the cycle immediately preceding the sampling.

As shown, while the first AD converter circuit 2011 is converting into D9–D6, the third AD converter circuit 2020 is concurrently converting into D2–D0 from the previous input. According to the pipeline process as described above, the AD converter as a whole is capable of outputting a digital value of 10 bits once in a cycle defined by the first clock signal CLK1.

Thus, according to the second example, a sample and hold circuit, provided according to the related art so as to be parallel with the AD converter circuit 2011 of the first stage, is eliminated in a pipeline AD converter comprising a plurality of stages. With this, the characteristics of the AD converter are improved. Particularly, the linear characteristics are improved. Accordingly, the use of a low voltage input is facilitated. Further, circuit area and power consumption are reduced.

Described above is a description of the second embodiment based on the examples. The description of the embodiment is illustrative in nature and various variations in constituting elements and processes involved are possible. Those skilled in the art would readily appreciate that the variations are also within the scope of the present invention.

Parameters such as the number of bits produced as a result of conversion, allocation of conversion bits, the gain of the amplifier circuits and the capacitance given in the description above of the examples are merely by way of example. Other parameter values may be employed in variations.

In the first example of the second embodiment, a description was given of the two-stage AD converter that includes a cyclic conversion part. In this respect, the second embodiment is applicable to an AD converter circuit of a cyclic type. In this case, the feedback route is selected by switching after the first AD conversion. The analog signal is amplified by the amplifier circuit in the feedback circuit and then fed again to the AD converter circuit and the subtracting amplifier circuit. With this, beneficial effects similar to those of the first example of the second embodiment are provided.

In the second example of the second embodiment, a description was given of the AD converter of a pipeline type comprising three stages. The number of stages is arbitrary. When the number of bits produced by conversion is large or when precision in conversion is to be improved, a pipeline comprising a larger number of stages may be built. The timing schedule illustrated in FIG. 16 is only by way of example. The period of time for amplification in the subtracting amplifier circuit 2013 may be extended to secure a settling time.

(Third Embodiment)

The art related to the third embodiment is discussed below. In recent years, a variety of additional functions are built in mobile appliances such as a mobile telephone set, including the image pick-up function, the image playback function, the moving image pick-up function and the moving image playback function. In association with this, there is an increasing demand for miniaturization and power saving of an analog-digital converter (hereinafter, referred to as an AD converter). One mode of AD converter that addresses this demand is known as a cyclic AD converter that cycles through stages (see, for example, the Related art list No. 1). The Related art list No. 1 discloses an AD converter comprising two stages that include a cyclic conversion part.

The first stage of the AD converter illustrated in FIG. 1 of the Related art list No. 1 is provided with the sample and hold circuit S/H1 parallel with a system comprising the parallel A/D converter AD1 and the DA converter DA1. An analog signal input to the circuit is held by the sample and hold circuit S/H1 for a predetermined period of time.

Since the sample and hold circuit includes an operational amplifier, the output voltage range of the sample and hold circuit tends to be limited in a low voltage operation. Limited output voltage range of the sample and hold circuit in a low voltage operation causes degradation in characteristics such as distortion, with the result that the characteristics of the AD converter as a whole may become poor accordingly. When the sample and hold circuit is eliminated, a timing error occurs and an idle time in which the amplifier circuit in a post-subtraction stage does not perform either an autozero operation or amplification. The term "autozero" refers to a period of time in which the amplifier circuit is sampling an input and does not provide any output signal.

The third embodiment will be summarized as follows. The third embodiment has been developed in view of the circumstances described above and its object is to reduce an idle time in which neither an autozero operation nor amplification is performed in an analog-digital converter.

The third embodiment according to one aspect provides an analog-digital converter. The analog-digital converter according to this aspect is an analog-digital converter converting an input analog signal into a digital signal in a plurality of steps using a plurality of stages, wherein each of the plurality of stages is provided with an analog-digital converter circuit comparing an input analog signal with a predetermined voltage and converting the analog signal into a digital value of a predetermined number of bits, and each of the plurality of stages is configured such that the input of the analog signal and the input of the predetermined reference voltage to the analog-digital converter circuit occur in whichever order desired.

According to this aspect, by configuring the timing of operation of the analog-digital converter circuit stage by stage, a degree of freedom is provided in setting a timing for sampling in elements such as an amplifier circuit for amplifying an analog signal input to the AD converter circuit. To describe the feature in further detail, the AD converter circuit and the amplifier circuit sample the input occurring at the end of the autozero period. When the AD converter circuit and the amplifier circuit sample the input signal according to the same timing schedule for synchronization in respect of points of time to sample the input signal, restriction is applied to the setting of autozero period and operation period of the circuits, with the result that an idle time may be created. By arranging the AD converter circuit to first sample the reference voltage and then receives the input signal in a period of time for comparison, the same output digital value as obtained in a normal sequence is obtained. With this, the restriction, demanding that the amplifier circuit and the AD converter circuit sample the input signal according to the same timing schedule, is lifted. Accordingly, it is possible to schedule the timing of operation of the circuits so that no idle time is created. Implementation of this arrangement using a simple control signal is also a feature of the embodiment.

The sequence of operation of the analog-digital converter circuit may differ in accordance with the structure of stages such that, the analog-digital converter circuit samples the analog signal at the end of a non-operating period and receives the predetermined reference voltage in a period of time for comparison, or samples the reference voltage at the end of the non-operating period and receives the analog signal in the period of time for comparison. By setting the timing of operation of the AD converter circuit in accordance with the arrangement of the amplifier circuit in respective stages, the timing of operation in which no idle time is created in the amplifier circuit can be scheduled. The "non-operating period" includes an autozero period.

The third embodiment according to another aspect also provides an analog-digital converter. The analog-digital converter according to this aspect is an analog-digital converter converting an input analog signal into a digital signal in a plurality of steps using a plurality of stages, comprising at least one each of: a stage of a first type provided with an amplifier element: and a stage of a second type provided with two amplifier elements, wherein an analog-digital converter circuit of the stage of the first type first samples a predetermined reference voltage and then receives an analog signal input to the stage in a period of time for comparison, and an analog-digital converter circuit of the stage of the second type first samples an analog signal input to the stage and then receives a predetermined reference voltage in a period of time for comparison.

The third embodiment according to another aspect also provides an analog-digital converter. The analog-digital converter according to this aspect is an analog-digital converter converting an input analog signal into a digital signal in a plurality of steps using a plurality of stages, comprising at least one each of: a stage of a first type which includes an analog-digital converter circuit comparing an analog signal input to the stage with a predetermined reference voltage so as to convert the analog signal into a digital of a predetermined number of bits, and a subtracting amplifier circuit sampling the analog signal and subtracting therefrom an analog signal corresponding to the digital value produced by conversion by the analog-digital converter circuit, and amplifying the analog signal after the subtraction by a predetermined gain; and a stage of a second type which includes an analog-digital converter circuit comparing an analog signal input to the stage with a predetermined reference voltage so as to convert the analog signal into a digital of a predetermined number of bits, a first amplifier circuit sampling the analog signal and amplifying the sampled signal by a predetermined gain or holding the sampled signal, a subtracter circuit subtracting, from an output analog signal from the first amplifier circuit, an analog signal corresponding to the digital value produced by conversion by the analog-digital converter circuit, and a second amplifier circuit amplifying an output analog signal from the subtracter circuit by a predetermined gain, wherein the analog-digital converter circuit of the stage of the first type first samples the predetermined reference voltage and then receives the analog signal input to the stage in a period of time for comparison, and the analog-digital converter circuit of the stage of the second type first samples the analog signal input to the stage and then receives the predetermined reference voltage in a period of time for comparison.

In a related-art stage comprising an amplifier element, the AD converter circuit and the amplifier element sample the input analog signal according to practically the same timing schedule, causing the amplifier element to sample in advance of the AD converter circuit. Since the amplifier circuit cannot proceed to amplification immediately, there is created an idle time. By adjusting the timing of operation of the AD converter circuit of the stage of the first type, an idle time, in which neither an autozero operation nor amplification is performed, is prevented from being created in elements constituting the stage of the first type.

The AD converter circuit of the first stage may first sample the predetermined reference voltage and then receive the analog signal input to the stage in a period of time comparison. With this, the first stage is formed as a stage of the first type. This enables the amplifier circuit parallel with the AD converter circuit to be eliminated so that degradation in characteristics due to the output voltage range of the amplifier circuit is prevented. The first sage receives the largest signal and is most affected by the degradation in characteristics. By configuring the first stage as a stage of the first type, adverse effects from degradation are prevented.

The plurality of stages may include a stage which feeds an output analog signal of the stage back to the input of the stage. With this, a stage can be used a plurality of times in operation, so that circuit area is reduced.

Arbitrary combinations of the aforementioned constituting elements, and implementations of the third embodiment in the form of methods, apparatus and systems may also be practiced as additional modes of the third embodiment.

In the AD converter of a pipe line type or a cyclic type in which an input analog signal is converted into a digital value in a plurality of steps, each stage constituting the AD converter performs one-step amplification or two-step amplification. In the examples of the third embodiment, an example of AD converter in which one-step amplification and two-step amplification are mixed will be described. To give a general background, a description will be given of the basic structure and basic operation of the one-step amplification and two-step amplification according to the third embodiment.

Figure 17:
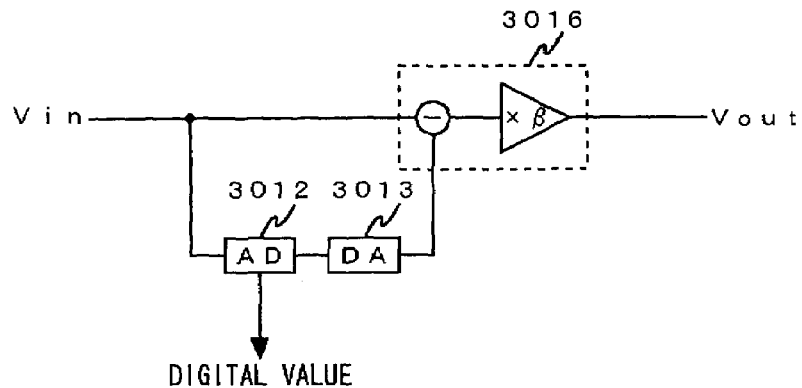
FIG. 17 illustrates the basic structure for one-step amplification according to a third embodiment of the present invention.

FIG. 17 illustrates the basic structure for one-step amplification. FIG. 17 illustrates a stage constituting the AD converter. The analog signal Vin input to this stage is sampled by a subtracting amplifier circuit 3016. An AD converter circuit 3012 converts the analog signal Vin into a digital value with a predetermined resolution. The AD converter circuit 3012 is of a flash type comprising a plurality of comparators. Reference voltages with a step size defined by the least significant bit (LSB) are supplied to respective comparators. Each of the comparators compares the supplied reference voltage with the sampled analog signal so as to output a high signal or a low signal.

The DA converter circuit 3013 converts outputs of the comparators of the AD converter circuit 3012 into an analog value. The subtracting amplifier circuit 3016 subtracts an output analog signal from the DA converter circuit 3013 from the sampled analog signal Vin and amplifies a result of subtraction by a predetermined gain. When the subtracting amplifier circuit 3016 is embodied by a switched capacitor operational amplifier, the capacitance coupled to the input terminal of the operational amplifier samples the analog signal Vin. An output analog signal from the subtracting amplifier circuit 3016 represents an output analog signal Vout output of the stage.

Figure 18:
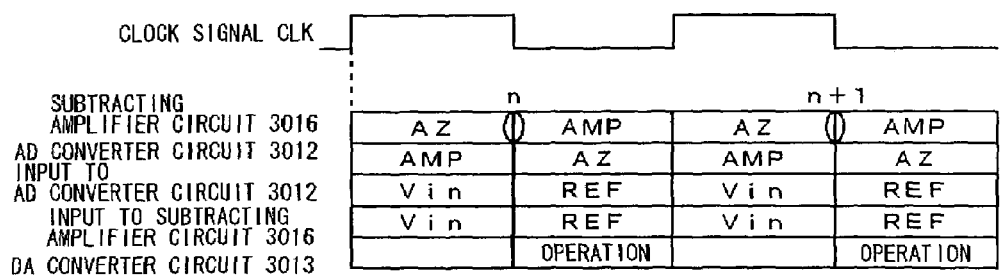
FIG. 18 is a time chart illustrating an example of operation of the circuit illustrated in FIG. 17 according to the third embodiment.

A description will be given of the timing of operation in this stage. FIG. 18 is a time chart illustrating an example of operation of the circuit illustrated in FIG. 17 according to the third embodiment. Referring to FIG. 18, the subtracting amplifier circuit 3016 and the AD converter circuit 3012 sample the input signal concurrently with a transition from an autozero mode to the period for amplification. The subtracting amplifier circuit 3016 is placed in an autozero operation mode while the clock signal CLK is high and performs subtraction and amplification while the clock CLK is low. The subtracting amplifier circuit 3016 receives the analog signal Vin while the clock CLK is high and samples the analog signal Vin at a high-to-low falling edge. In the low period, the data subjected to conversion in the DA converter circuit 3013 are input to the subtracting amplifier circuit 3016.

The AD converter circuit 3012 operates for comparison and outputs a result of comparison while the clock signal CLK is high, and is in an autozero operation mode while the clock signal CLK is low. The reference voltage is fed to each of the comparators in the AD converter circuit 3012 while the clock signal CLK is low. The comparator sample the reference voltage at a low-to-high rising edge of the clock signal CLK. The comparator receives the analog signal Vin while the clock signal CLK is high.

The DA converter circuit 3013 is in an undefined state while the clock signal CLK is high and holds the data subjected to the DA conversion while the clock signal CLK is low. The output from the AD converter circuit 3012 supplied at a high-to-low falling edge is held while the clock signal CLK remains low.

Figure 19:
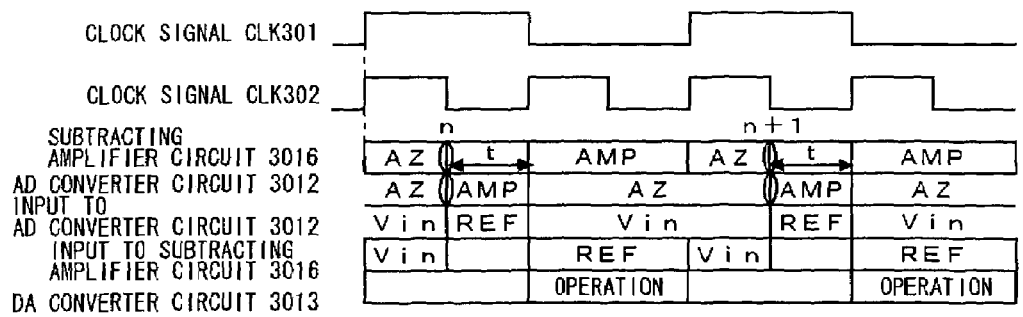
FIG. 19 is a time chart illustrating a comparative example of operation of the circuit illustrated in FIG. 17 according to the third embodiment.

A description will now be given of the timing of other aspects of operation in this stage. FIG. 19 is a time chart illustrating a comparative example of operation of the circuit illustrated in FIG. 17. Referring to FIG. 19, two clock signals CLK are necessary in this comparative example of operation. The frequency of the second clock signal CLK2 is twice as high as that of the first clock signal CLK1.

The subtracting amplifier circuit 3016 performs subtraction and amplification when the first clock signal CLK1 is low and is placed in an autozero operation mode when the second clock signal CLK2 is high in the subsequent cycle defined the first clock signal CLK1. The subtracting amplifier circuit 3016 samples the analog signal Vin at a high-to-low falling edge of the second clock signal CLK2 in a period when the first clock signal CLK1 is high. The subtracting amplifier circuit 3016 receives the data subjected to DA conversion in the DA converter circuit 3013 in the aforementioned period for subtraction and amplification, and receives the analog signal Vin in the aforementioned autozero period. An idle time t, in which neither an autozero operation nor amplification is performed, is created while the second clock signal CLK2 is low in a period when the clock signal CLK1 is high.

The AD converter circuit 3012 is placed in an autozero operation mode in a period when the first clock signal CLK1 is low and in a subsequent period when the second clock signal CLK2 is high. In a subsequent period when the second clock signal CLK2 is low, the AD converter circuit 3012 operates for comparison and outputs a result of comparison. The AD converter circuit 3012 samples the analog signal Vin according to the same timing schedule as the subtracting amplifier circuit 3016 sampling the analog signal Vin. In the aforementioned autozero period, each of the comparators in the AD converter circuit 3012 receives the analog signal Vin. The AD converter circuit 3012 receives the predetermined reference voltage in the aforementioned period for comparison.

The DA converter circuit 3013 is in an undefined state while the first clock signal is high and holds the data subjected to the DA conversion while the first clock signal CLK1 remains low. The DA converter circuit receives the result of comparison in the AD converter circuit 3012 at a high-to-low falling edge of the first clock signal CLK1 holds the result while the first clock signal CLK1 remains low.

As described above, an idle time t, in which neither an autozero operation nor amplification is performed, is created in the subtracting amplifier circuit 3016, according to the comparative example of operation. This is due to the fact that the AD converter circuit 3012 and the subtracting amplifier circuit 3016 sample the analog signal Vin according to the same timing schedule. More specifically, in contrast with the AD converter circuit 3012, which is capable of starting an operation for comparison with the reference voltage, immediately after sampling the analog signal Vin, the subtracting amplifier circuit 3016 cannot perform subtraction and amplification until the DA converter circuit 3013 completes the DA conversion. Accordingly, the AD converter circuit 3012 and the subtracting amplifier circuit 3016 in the comparative example of operation should be controlled by the second clock signal CLK2 which is of a higher speed than the clock signal CLK used in the timing schedule of FIG. 18.

In contrast, in the example of operation of FIG. 18, the comparators in the AD converter circuit 3012 first sample the reference voltage and then receive the analog signal Vin in a period for comparison. With this, it is not necessary to advance the timing of sampling of the analog signal Vin by the subtracting amplifier circuit 3016, with the result that a longer autozero period is secured than in the comparative variation. In addition, a longer period of time for comparison in the AD converter circuit 3012 is secured than in the comparative variation. Accordingly, a signal such as the second clock signal CLK2 of the comparative variation, characterized by a higher speed, is not necessary.

Figure 20:
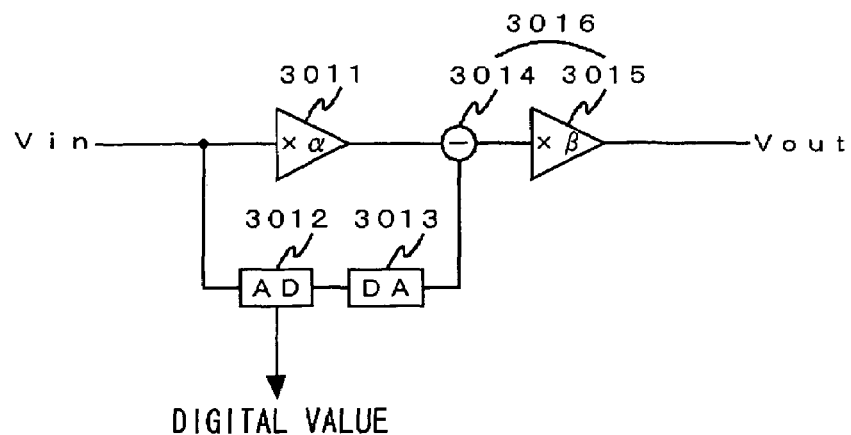
FIG. 20 illustrates the basic structure for two-step amplification according to the third embodiment.

FIG. 20 illustrates the basic structure for two-step amplification. FIG. 20 illustrates a stage constituting the AD converter. The input analog signal Vin fed to this stage is sampled by the first amplifier circuit 3011 and the AD converter circuit 3012. The first amplifier circuit 3011 amplifies the sampled analog signal by a predetermined gain and outputs the amplified signal to the subtracting amplifier circuit 3014 or the subtracting amplifier circuit 3016. Alternatively, the first amplifier circuit 3011 holds the input analog signal Vin for a predetermined period of time and outputs the signal thus held to the subtracting circuit 3014 or the subtracting amplifier circuit 3016.

An AD converter circuit 3012 converts the sampled analog signal Vin into a digital value with a predetermined resolution. The DA converter circuit 3013 converts an output of the AD converter circuit 3012 into an analog value. The output of the AD converter circuit 3012 is converted into the analog signal and amplified in accordance with the gain of the first amplifier circuit 3011. The amplification is implemented by adjusting the ratio between the reference voltage range supplied to the AD converter circuit 3012 and the reference voltage range supplied to the DA converter circuit 3013. When the DA converter circuit 3013 is configured to include a capacitor array, the adjustment may be done by controlling the number of capacitors.

The subtracter circuit 3014 subtracts an output analog signal from the first DA converter circuit 3013 from an output analog signal from the first amplifier circuit 3011. The second amplifier circuit 3015 samples an output analog signal from the subtracter circuit 3014 and amplifies the sampled signal by a predetermined gain. An output analog signal from the second amplifier circuit 3015 represents an analog signal Vout output from the stage. When the subtracting amplifier circuit 3016 is used instead of the subtracter circuit 3014 and the second amplifier circuit 3015, the subtracting amplifier circuit 3016 samples the output analog signal from the first amplifier circuit 3011 and amplifies the sampled signal by a predetermined gain.

Figure 21:
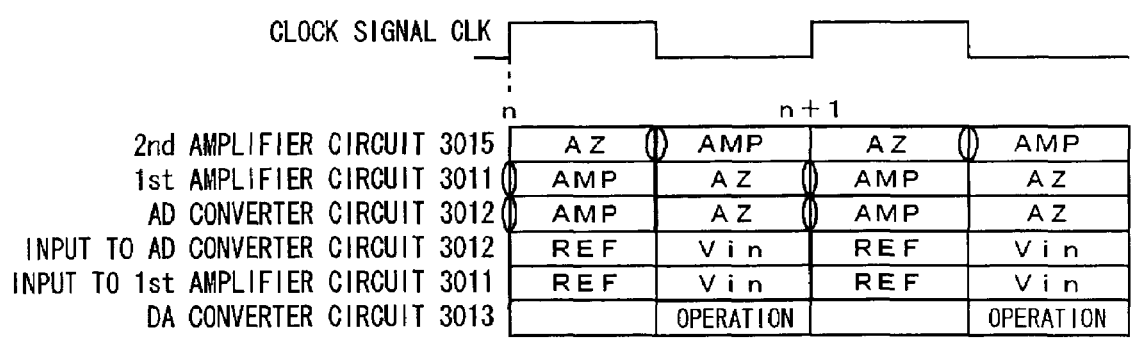
FIG. 21 is a time chart illustrating an example of operation of the circuit illustrated in FIG. 20 according to the third embodiment.

A description will be given of the timing of operation in this stage. FIG. 21 is a time chart illustrating an example of operation of the circuit illustrated in FIG. 20. Referring to FIG. 21, the first amplifier circuit 3011 amplifies the sampled analog signal when the first clock signal CULL is high and is placed in an autozero operation mode when the clock signal CLK is low. The first amplifier circuit 3011 receives the analog signal Vin while the clock CLK is low and samples the analog signal Vin at a low-to-high rising edge. The first amplifier circuit 3011 receives the predetermined reference voltage while the clock signal CLK is high.

The AD converter circuit 3012 operates for comparison and outputs a result of comparison while the clock signal CLK is high, and is in an autozero operation mode while the clock signal CLK is low. The comparators in the AD converter circuit 3012 receive the analog signal Vin while the clock CLK is low and sample the analog signal Vin at a low-to-high rising edge. The AD converter circuit 3012 receives the predetermined reference voltage while the clock signal CLK is high.

The DA converter circuit 3013 is in an undefined state while the first clock signal is high and holds the data subjected to the DA conversion while the first clock signal CLK1 remains low. The output from the DA converter circuit 3013 at a high-to-low falling edge is held while the clock signal CLK remains low.

The second amplifier circuit 3015 is placed in an autozero operation mode while the clock signal CLK is high and performs subtraction and amplification while the clock CLK is low. The second amplifier circuit 3015 samples a difference between an output from the first amplifier circuit 3011 and an output from the DA converter circuit 3013 at a high-to-low falling edge of the clock signal CLK, and receives the predetermined reference voltage while the clock signal CLK is low. When the subtracting amplifier circuit 3016 is used, the subtracting amplifier circuit 3016 is placed in an autozero operation mode when the clock signal CLK is high, and performs subtraction and amplification when the clock signal is low. The subtracting amplifier circuit 3016 receives the output analog signal from the first amplifier circuit 3011 while the clock CLK is high and samples the output analog signal at a high-to-low falling edge. In the low period, the data subjected to conversion in the DA converter circuit 3013 are input to the subtracting amplifier circuit 3016.

As described, in two-step amplification, the first amplifier circuit 3011 and the AD converter circuit 3012 sample the analog signal Vin concurrently. While the AD converter circuit 3012 is operating for conversion by making a comparison with the analog signal Vin, the first amplifier circuit 3011 is holding or amplifying the analog signal Vin. Therefore, the second amplifier circuit 3015 is required to sample a difference between an output from the first amplifier circuit 3011 and an output from the DA converter circuit 3013 after the DA converter circuit 3013 completed the DA conversion. Thus, no idle time t is created. By allowing the first amplifier circuit 3011 to amplify the analog signal Vin while the AD converter circuit 3012 is operating for conversion, the gain of the second amplifier circuit 3015 can be lowered to enable a high-speed operation of the second amplifier circuit 3015.

(First Example of the Third Embodiment)

A description will now be given of a first example of the third embodiment. The first example provides an AD converter of a pipeline type comprising four stages in which the AD converter circuit in the first stage converts into 4 bits and each of the AD converter circuits in the second through fourth stages converts into 2 bits. The first stage is for one-step amplification and the second stage is for two-step amplification.

Figure 22:
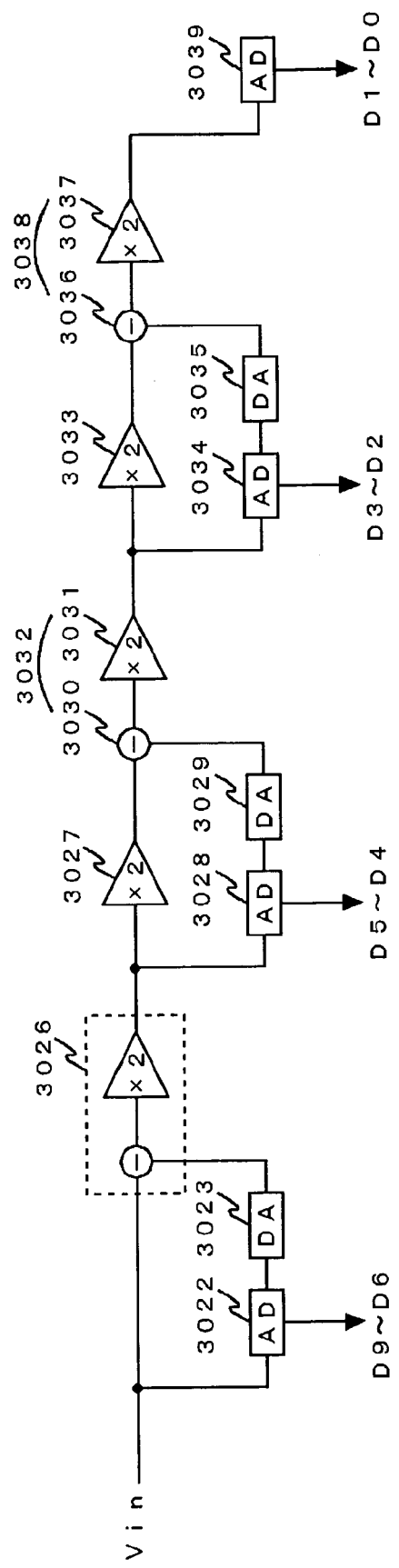
FIG. 22 illustrates the structure of an AD converter according to a first example of the third embodiment.

FIG. 22 illustrates the structure of the AD converter according to the first example. In this AD converter, the input analog signal Vin is fed to a first subtracting amplifier circuit 3026 and a first AD converter circuit 3022. The first AD converter circuit 3022 is of a flash type and the resolution thereof, i.e. the number of bits produced by conversion therein, is 4 bits. The first AD converter circuit 3022 converts the input analog signal Vin into a digital value so as to retrieve the higher 4 bits (D9–D6) A first DA converter circuit 3023 converts the digital value produced by conversion by the first AD converter circuit 3022 into an analog value. The subtracting amplifier circuit 3026 subtracts an output analog signal from the DA converter circuit 3023 from the sampled analog signal Vin and amplifies a result of subtraction by a gain of 2.

The output analog signal from the first amplifier circuit 3026 is fed to a third amplifier circuit 3027 and a second AD converter circuit 3028. The third amplifier circuit 3027 and second AD converter circuit 3028 sample according to the same timing schedule. The third amplifier circuit 3027 samples the input analog signal, amplifies the same by a factor of 2 and outputs the amplified signal to a second subtracter circuit 3030. The second AD converter circuit 3028 samples the input analog signal, converts the same into a digital value and retrieves the 5th through 6th highest bits (D5, D4).

Since the second stage is tasked with converting into 2 bits, the output of the first stage should practically be amplified by a factor of 4 (2 raised to the 2nd power). In the first stage, the first subtracting amplifier circuit 3026 amplifies by a factor of 2. In addition to this, the reference voltage for the comparators of the second AD converter circuit 3028 is set to 1/2 that of the first AD converter circuit 3022, thereby implementing the aforementioned amplification by a factor of 4.

The second DA converter circuit 3029 converts the digital value produced by conversion by the second AD converter circuit 3028 into an analog value. The output of the second AD converter circuit 3028 is converted into the analog signal and amplified by a gain of 2. The second subtracter circuit 3030 subtracts an output analog signal from the second DA converter circuit 3029 from an output analog signal from the third amplifier circuit 3027. A fourth amplifier circuit 3031 amplifies an output analog signal from the second subtracter circuit 3030 by a factor of 2. A second subtracting amplifier circuit 3032 of an integral type may be used instead of the second subtracter circuit 3030 and the fourth amplifier circuit 3031. In this way, circuit area is reduced.

The output analog signal from the fourth amplifier circuit 3031 is fed to a fifth amplifier circuit 3033 and a third AD converter circuit 3034. The fifth amplifier circuit 3033 and the third AD converter circuit 3034 sample according to the same timing schedule. The fifth amplifier circuit 3033 samples the input analog signal, amplifies the same by a factor of 2 and outputs the amplified signal to a third subtracter circuit 3036. The third AD converter circuit 3034 samples the input analog signal, converts the same into a digital value and retrieves the 7th through 8th highest bits (D3, D2).

A third DA converter circuit 3035 converts the digital value produced by conversion by the third AD converter circuit 3034 into an analog value. The output of the third AD converter circuit 3034 is converted into the analog signal and amplified by a gain of 2. The third subtracter circuit 3036 subtracts an output analog signal from the third DA converter circuit 3035 from an output analog signal from the fifth amplifier circuit 3033. A sixth amplifier circuit 3037 amplifies an output analog signal from the third subtracter circuit 3036 by a factor of 2. A third subtracting amplifier circuit 3038 of an integral type may be used instead of the third subtracter circuit 3036 and the sixth amplifier circuit 3037.

An output analog signal from the sixth amplifier circuit 3037 is fed to a fourth AD converter circuit 3039. The fourth AD converter circuit 3039 samples the input analog signal, converts the same into a digital value and retrieves the 9th through 10th highest bits (D1–D0). With this, a 10-bit digital value is obtained using four stages.

Figure 23:
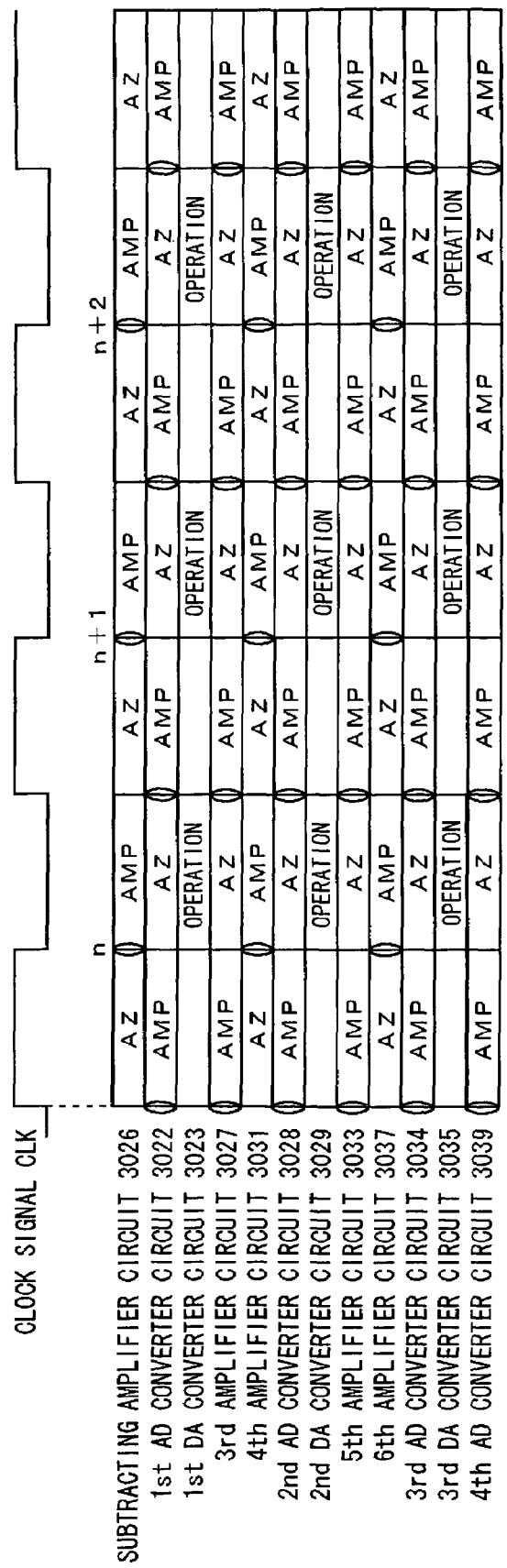
FIG. 23 is a time chart illustrating the operating process of the AD converter according to the first example of the third embodiment.

A description will now be given of the timing of operation of the AD converter according to the first example. FIG. 23 is a time chart illustrating the operating process of the AD converter according to the first example. A description will be given of the timing of operation in the first stage. The first subtracting amplifier circuit 3026 samples the input analog signal Vin at a high-to-low falling edge of the clock signal CLK. The subtracting amplifier circuit 3026 is placed in an autozero operation mode when the clock signal CLK is high, subtracts an output analog signal from the first DA converter circuit 3023 from the sampled analog signal Vin and amplifies a result of subtraction, when the clock signal CLK is low. The second AD converter circuit 3028 samples the predetermined reference voltage at a low-to-high rising edge of the clock signal CLK. The second AD converter circuit 3028 operates for comparison while the clock signal CLK is high, and is in an autozero operation mode while the clock signal CLK is low. The second AD converter circuit 3028 receives the analog signal Vin at a high-to-low falling edge of the clock signal CLK. The first DA converter circuit 3023 holds the data subjected to the DA conversion while the clock signal CLK is low, and is in an undefined state while the clock signal CLK is high.

A description will be given of the timing of operation in the second stage. The third amplifier circuit 3027 and the second AD converter circuit 3028 sample the output analog signal from the first subtracting amplifier circuit 3026 at a low-to-high rising edge of the clock signal CLK. The third amplifier circuit 3027 amplifies the sampled analog signal when the first clock signal CLK is high and is placed in an autozero operation mode when the clock signal CLK is low. The second AD converter circuit 3028 operates for comparison while the clock signal CLK is high, and is in an autozero operation mode while the clock signal CLK is low. The second DA converter circuit 3029 holds the data subjected to the DA conversion while the clock signal CLK is low, and is in an undefined state while the clock signal CLK is high.

The fourth amplifier circuit 3031 samples a difference between an output from the third amplifier circuit 3027 and an output from the second DA converter circuit 3029 at a high-to-low falling edge of the clock signal CLK. The fourth amplifier circuit 3031 amplifies the sampled analog signal when the first clock signal CLK is low and is placed in an autozero operation mode when the clock signal CLK is high. When the second subtracting amplifier circuit 3032 is used, the second subtracting amplifier circuit 3032 samples an output analog signal from the third amplifier circuit 3027 at a high-to-low falling edge of the clock signal CLK. The second subtracting amplifier circuit 3032 subtracts an output analog signal from the second DA converter circuit 3029 from the sampled analog signal and amplifies a result of subtraction, when the clock signal CLK is low, and is placed in an autozero operation mode, when the clock signal CLK is high.

A description will be given of the timing of operation in the third stage. The fifth amplifier circuit 3033 and the third AD converter circuit 3034 sample the output analog signal from the fourth amplifier circuit 3031 at a low-to-high rising edge of the clock signal CLK. The fifth amplifier circuit 3033 amplifies the sampled analog signal when the first clock signal CLK is high and is placed in an autozero operation mode when the clock signal CLK is low. The third AD converter circuit 3034 operates for comparison while the clock signal CLK is high, and is in an autozero operation mode while the clock signal CLK is low. The third DA converter circuit 3035 holds the data subjected to the DA conversion while the clock signal CLK is low, and is in an undefined state while the clock signal CLK is high.

The sixth amplifier circuit 3037 samples a difference between an output from the fifth amplifier circuit 3033 and an output from the third DA converter circuit 3035 at a high-to-low falling edge of the clock signal CLK. The sixth amplifier circuit 3037 amplifies the sampled analog signal when the clock signal CLK is low and is placed in an autozero operation mode when the clock signal CLK is high. When the third subtracting amplifier circuit 3038 is used, the third subtracting amplifier circuit 3038 samples the output analog signal from the fifth subtracting amplifier circuit 3033 at a high-to-low falling edge of the clock signal CLK. The third subtracting amplifier circuit 3038 subtracts an output analog signal from the third DA converter circuit 3035 from the sampled analog signal and amplifies a result of subtraction, when the clock signal CLK is low, and is placed in an autozero operation mode, when the clock signal CLK is high.

The fourth DA converter circuit 3039 of the fourth stage samples the output analog signal from the sixth amplifier circuit 3037 at a low-to-high rising edge of the clock signal CLK. The fourth AD converter circuit 3039 operates for comparison while the clock signal CLK is high, and is in an autozero operation mode while the clock signal CLK is low. Thus, the pipeline process is realized by allowing the four AD converter circuits 3022, 3034 and 3039 to convert from different input analog signals Vin at the same clock timing.

Figure 24:
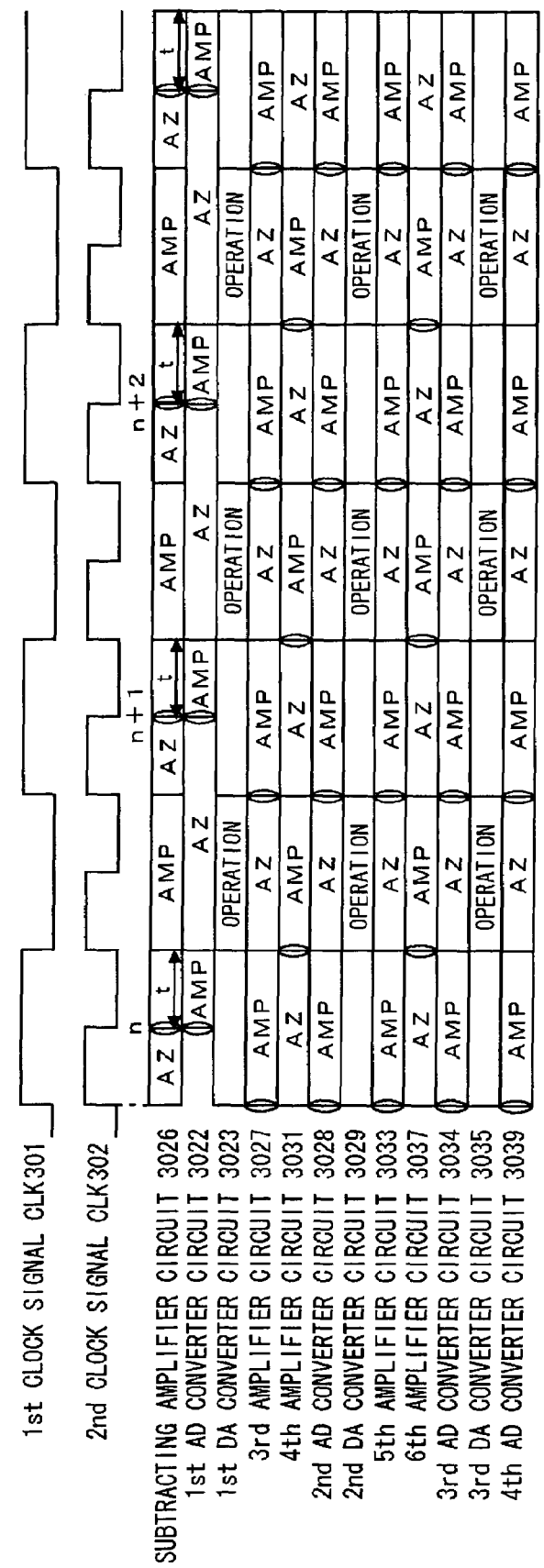
FIG. 24 is a time chart illustrating the operating process of the AD converter according to a comparative variation of the first example of the third embodiment.

A description will now be given of the timing of operation of the AD converter according to a comparative variation of the first example. FIG. 24 is a time chart illustrating the operating process of the AD converter according to the comparative variation of the first example. Only the description of the first stage will be given since the second and subsequent stages are timed according to the same timing schedule of FIG. 23. In this comparative variation, two clock signals CLK are necessary. The frequency of the second clock signal CLK2 is twice as high as that of the first clock signal CLK1.

The first subtracting amplifier circuit 3026 samples the input analog signal Vin at every second high-to-low falling edge of the second clock signal CLK2. The first subtracting amplifier circuit 3026 subtracts an output analog signal from the first DA converter circuit 3023 from the sampled analog signal Vin and amplifies a result of subtraction, when the first clock signal CLK1 is low. The first subtracting amplifier circuit 3026 is placed in an autozero operation mode while the second clock signal CLK2 is low in a period when the clock signal CLK1 is high. An idle time t, in which neither an autozero operation nor amplification is performed, is created while the second clock signal CLK2 is low in a period when the clock signal CLK1 is high.

The first AD converter circuit 3022 samples the input analog signal Vin according to the same timing schedule as the first subtracting amplifier circuit 3026 sampling the input analog signal Vin. The first AD converter circuit 3022 is placed in an autozero operation mode in a period when the first clock signal CLK1 is low and in a subsequent period when the second clock signal CLK2 is high. In a subsequent period when the second clock signal CLK2 is low, the AD converter circuit 3022 operates for comparison and outputs a result of comparison. The first DA converter circuit 3023 holds the data subjected to the DA conversion while the first clock signal CLK1 is low, and is in an undefined state while the first clock signal CLK1 is high.

As described above, an idle time t, in which neither an autozero operation nor amplification is performed, is created in the first subtracting amplifier circuit 3026, according to this comparative variation. This is due to the fact that the first AD converter circuit 3022 and the first subtracting amplifier circuit 3026 sample the analog signal Vin according to the same timing schedule. More specifically, in contrast with the first AD converter circuit 3022, which is capable of starting an operation for comparison with the reference voltage, immediately after sampling the analog signal Vin, the first subtracting amplifier circuit 3026 cannot perform subtraction and amplification until the first DA converter circuit 3023 completes the DA conversion. Accordingly, the first AD converter circuit 3022 and the first subtracting amplifier circuit 3026 in the comparative variation should be controlled by the second clock signal CLK2 which is of a higher speed than the clock signal CLK used in the timing schedule of FIG. 23.

In contrast, in the example of operation illustrated in FIG. 23, the first AD converter circuit 3022 first samples the reference voltage and then receives the analog signal Vin in a period for comparison. With this, it is not necessary to advance the timing of sampling of the analog signal Vin by the first subtracting amplifier circuit 3026, with the result that a longer autozero period is secured than in the comparative variation. Accordingly, a signal such as the second clock signal CLK2 of the comparative variation, characterized by a higher speed, is not necessary.

Thus, according to the first example, the AD converter of a pipeline type, in which a one-step amplification stage and a two-step amplification stage are mixed, can be operated without creating any idle time t. It is not necessary to generate a second clock signal CLK dedicated to the control of the one-step amplification stage. A common clock signal CLK can control the entire stages. By configuring the first stage as a one-step amplification stage, the characteristics of the AD converter as a whole are improved. The signal input to the first stage is the largest since it is not processed by any subtracter circuits. When an amplifier circuit is provided parallel with the AD converter circuit as in the case of two-step amplification, the characteristics may be degraded due to the fact that the performance is bounded by the output voltage range of the amplifier circuit. When the power supply voltage is dropped, the output voltage range becomes less extensive accordingly, causing degradation to become more serious.

As described before, an advantage of two-step amplification is that the input signal can be amplified concurrently with the AD conversion in the stage where two-amplification is performed. Accordingly, the gain of the amplifier circuit for the second step may be lowered to enable a high-speed operation of the amplifier circuit. This enables the frequency of the clock signal CLK to be increased. Thus, according to the first example, improvement in the characteristics and a high-speed operation are both achieved without creating an idle time t.

(Second Example of the Third Embodiment)

A second example of the third embodiment provides an AD converter in which a preceding stage of a non-cyclic type converts into 4 bits using one-step amplification, and a subsequent stage of a cyclic type converts into 2 bits in each cycle using two-step amplification. By allowing the subsequent stage to go through 3 cycles, a total of 10 bits are output.

Figure 25:
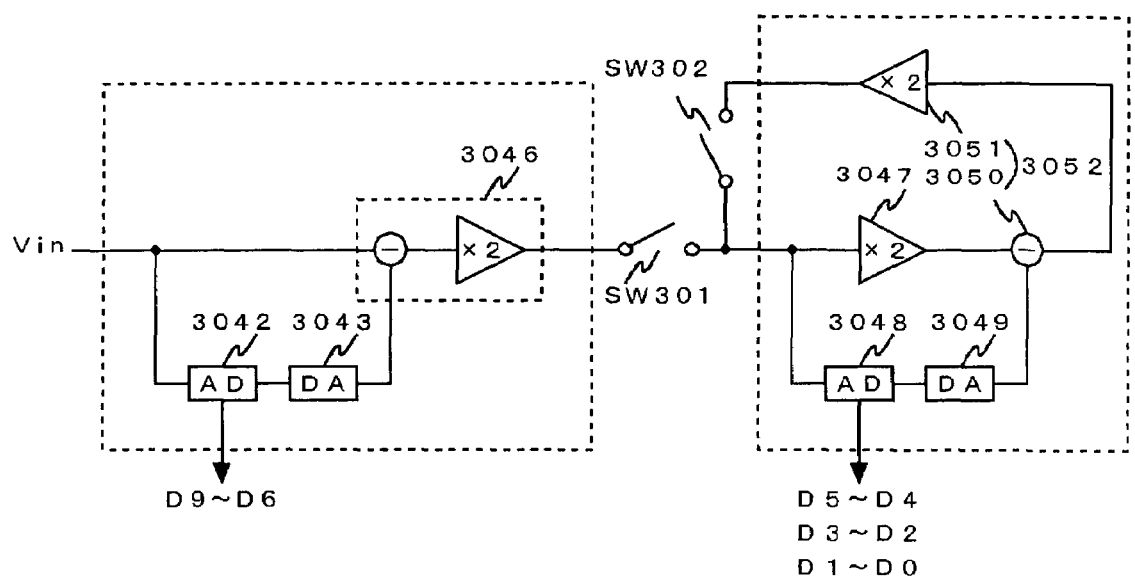
FIG. 25 illustrates the structure of an AD converter according to a second example of the third embodiment.

FIG. 25 illustrates the structure of the AD converter according to the second example. A description will be given of the preceding stage of the AD converter. The input analog signal Vin is fed to a first AD converter circuit 3042 and a first subtracting amplifier circuit 3046. The first AD converter circuit 3042 is of a flash type and the resolution thereof, i.e. the number of bits produced by conversion therein, is 4 bits. The first AD converter circuit 3042 samples the input analog signal Vin, converts the same into a digital value so as to retrieve the higher 4 bits (D9–D6) and outputs the bits to the encoder (not shown) and a first DA converter circuit 3043. The first DA converter circuit 3043 converts the digital value produced by conversion by the first AD converter circuit 3042 into an analog value. The first subtracting amplifier circuit 3046 samples the input analog signal Vin, subtracts an output analog signal from the first DA converter circuit 3043 from the input analog signal Vin, and amplifies a result of subtraction by a gain of 2.

A description will now be given of the subsequent stage. A first switch SW301 and a second switch SW302 are alternately turned on and off. The analog signal, input from the first subtracting amplifier circuit 3046 of the preceding stage via the first switch SW301 when the first switch SW301 is turned on and the second switch SW302 is turned off, is fed to a third amplifier circuit 3047 and a second AD converter circuit 3048. The second AD converter circuit 3048 is also of a flash type and the resolution thereof, i.e. the number of bits including the redundant 1 bit, is 3 bits. The reference voltage for the comparators in the second AD converter circuit 3048 is set to 1/2 that of the first AD converter circuit 3042. The second AD converter circuit 3048 samples the output analog signal from the first subtracting amplifier circuit. 3046, converts the same into a digital value so as to retrieve the 5th through 6th highest bits (D5, D4) and outputs the bits to the encoder (not shown) and a second DA converter circuit 3049.

The second DA converter circuit 3049 converts the digital value produced by conversion by the second AD converter circuit 3048 into an analog value. The output of the second AD converter circuit 3048 is converted into the analog signal and amplified by a gain of 2. The third amplifier circuit 3047 samples the output analog signal from the first subtracting amplifier circuit 3046, amplifies the same by a factor of 2 and outputs the amplified signal to a second subtracter circuit 3050. The second subtracter circuit 3050 subtracts an output analog signal from the second DA converter circuit 3049 from an output analog signal from the third amplifier circuit 3047 and outputs a result of subtraction to a fourth amplifier circuit 3051.

A fourth amplifier circuit 3051 amplifies an output analog signal from the second subtracter circuit 3050 by a factor of 2. At this point of time, the first switch SW301 is turned off and the second switch SW302 has made a transition to an on state. The output analog signal from the fourth amplifier circuit 3051 is fed back to the third amplifier circuit 3047 and the second AD converter circuit 3048 via the second switch SW302. The second subtracter circuit 3050 and the fourth amplifier circuit 3051 may be a second subtracting amplifier circuit 3052 of an integral type. The process described above is repeated so that the second DA converter circuit 3049 retrieves the 7th through 8th highest bits (D3, D2) and the 9th through 10th highest bits (D1, D0). With this, a 10-bit digital value is obtained. The 5th through 10th highest bits are obtained by the subsequent stage of a cyclic type.

Figure 26:
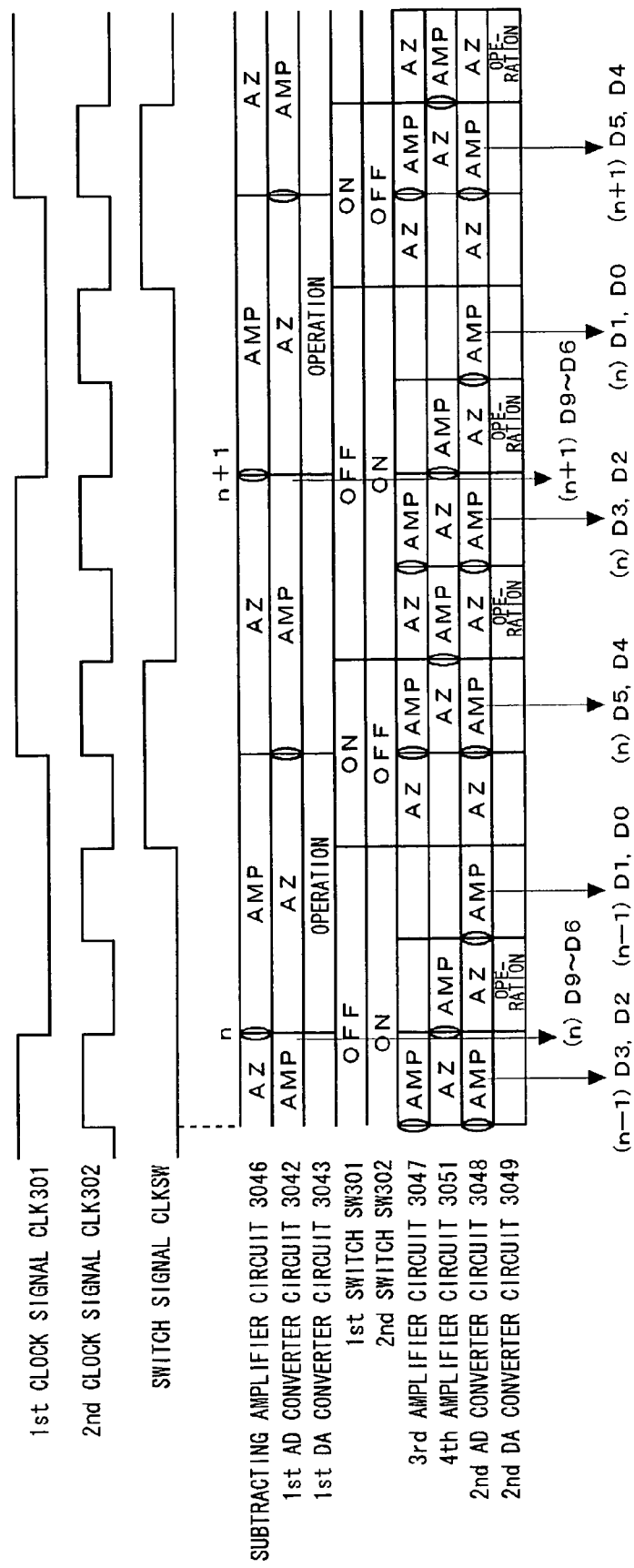
FIG. 26 is a time chart illustrating the operating process of the AD converter according to the second example of the third embodiment.

A description will now be given of the timing of operation of the AD converter according to the second example. FIG. 26 is a time chart illustrating the operating process of the AD converter according to the second example. The process will be described from the first step downward in the figure. Three waveforms at the top are for a first clock signal CLK1, a second clock signal CLK2 and a switch signal CLKSW in the illustrated order. The first clock signal CLK1 controls the operation of the first subtracting amplifier circuit 3046, the first AD converter circuit 3042 and the first DA converter circuit 3043. The second clock signal CLK2 controls the operation of the third amplifier circuit 3047, the fourth amplifier circuit 3051, the second AD converter circuit 3048 and the second DA converter circuit 3049. The switch signal CLKSW effects on/off control of the first switch SW301 and the second switch SW302.

The frequency of the second clock signal CLK2 is three times that of the first clock signal CLK1. The second clock signal CLK2 may be generated by multiplying the first clock signal CLK1 using a PLL or the like. A rising edge of the second clock signal CLK2 is synchronized with a rising edge of the first clock signal CLK1. Subsequently, a third falling edge of the second clock signal CLK2 is synchronized with a second falling edge of the first clock signal CLK1. Further, a fourth rising edge of the second clock signal CLK2 is synchronized with a second rising edge of the first clock signal CLK1. Since the frequency of the second clock CLK2 is three times that of the first clock signal CLK1, the conversion speed in the subsequent stage is three times that of the conversion speed in the preceding stage. Analog processes such as subtraction and amplification for conversion into relatively higher bits largely affect overall precision in conversion. Therefore, higher precision is required of the preceding stage responsible for conversion into relatively higher bits. In this respect, it is possible to increase the speed of operation in the subsequent stage as compared to the preceding stage, since the subsequent stage is not required to provide precision as high as that required in the preceding stage.

The first subtracting amplifier circuit 3046 samples the input analog signal Vin at a falling edge of the first clock signal CLK1. The first subtracting amplifier circuit 3046 subtracts an output analog signal from the first DA converter circuit 3043 from the sampled analog signal Vin and amplifies a result of subtraction, when the first clock signal CLK1 is low. The first subtracting amplifier circuit 3046 is placed in an autozero operation mode while the first clock signal CLK1 is high. The first AD converter circuit 3042 samples the predetermined reference voltage at a rising edge of the first clock signal CLK1. The first AD converter circuit 3042 operates for conversion and outputs a digital value comprising the bits D9–D6 while the first clock signal CLK1 is high, and is in an autozero operation mode while the first clock signal CLK1 is low. The first DA converter circuit 3013 holds the data subjected to the DA conversion while the first clock signal CLK1 is low, and is in an undefined state while the first clock signal CLK1 is high.

The first switch SW301 is turned on when the switch signal CLKSW is high and turned off when the switch signal CLKSW is low. The second switch SW302 is turned on when the switch signal CLKSW is low and turned off when the switch signal CLKSW is high.

The third amplifier circuit 3047 and the second AD converter circuit 3048 sample the input analog signal at a rising edge of the second clock signal CLK2. The third amplifier circuit 3047 amplifies the sampled analog signal when the second clock signal CLK2 is high and is placed in an autozero operation mode when the second clock signal CLK2 is low. The third amplifier circuit 3048 does not amplify while the second AD converter circuit 3048 converts into the lowest bits D1, D0. The fourth amplifier circuit 3051 samples a difference between an output analog signal from the third amplifier circuit 3047 and an output analog signal from the second DA converter circuit 3049 at a falling edge of the second clock signal CLK2. The fourth amplifier circuit 3051 amplifies the sampled analog signal when the second clock signal CLK2 is low and is placed in an autozero operation mode when the second clock signal CLK2 is high. When the second subtracting amplifier circuit 3052 is used instead of the fourth amplifier circuit 3051, the second subtracting amplifier circuit 3052 samples the output analog signal from the third amplifier circuit 3047 at a falling edge of the second clock signal CLK2. The second subtracting amplifier circuit 3032 subtracts an output analog signal from the second DA converter circuit 3049 from the sampled analog signal and amplifies a result of subtraction, when the second clock signal CLK2 is low. The second subtracting amplifier circuit 3052 is placed in an autozero operation mode while the second clock signal CLK2 is high. Amplification is not performed during the subsequent half-clock period after the second AD converter circuit 3048 converted into the bits D1, D0.

The second AD converter circuit 3048 samples the input analog signal at a rising edge of the second clock signal CLK2. The second AD converter circuit 3048 operates for conversion and outputs a digital value comprising 3 bits including redundant bits, while the second clock signal CLK2 is high, and is in an autozero operation mode while the second clock signal CLK2 is low. The second DA converter circuit 3049 holds the data subjected to the DA conversion while the second clock signal CLK2 is low, and is in an undefined state while the second clock signal CL2 is high. Conversion is not performed when the second AD converter circuit 3048 outputs the bits D1, D0.

In an autozero period, the first subtracting amplifier circuit 3046, the third amplifier circuit 3047, the fourth amplifier circuit 3051, the first AD converter circuit 3042 and the second AD converter circuit 3048 is operating to sample the input signal. As shown, while the second AD converter circuit 3048 is converting into D5, D4 and D3, D2, the first AD converter circuit 3042 is converting from a subsequently input analog signal Vin concurrently. According to the pipeline process as described above, the AD converter as a whole is capable of outputting a digital value of 10 bits once in a cycle defined by the first clock signal CLK1.

Figure 27:
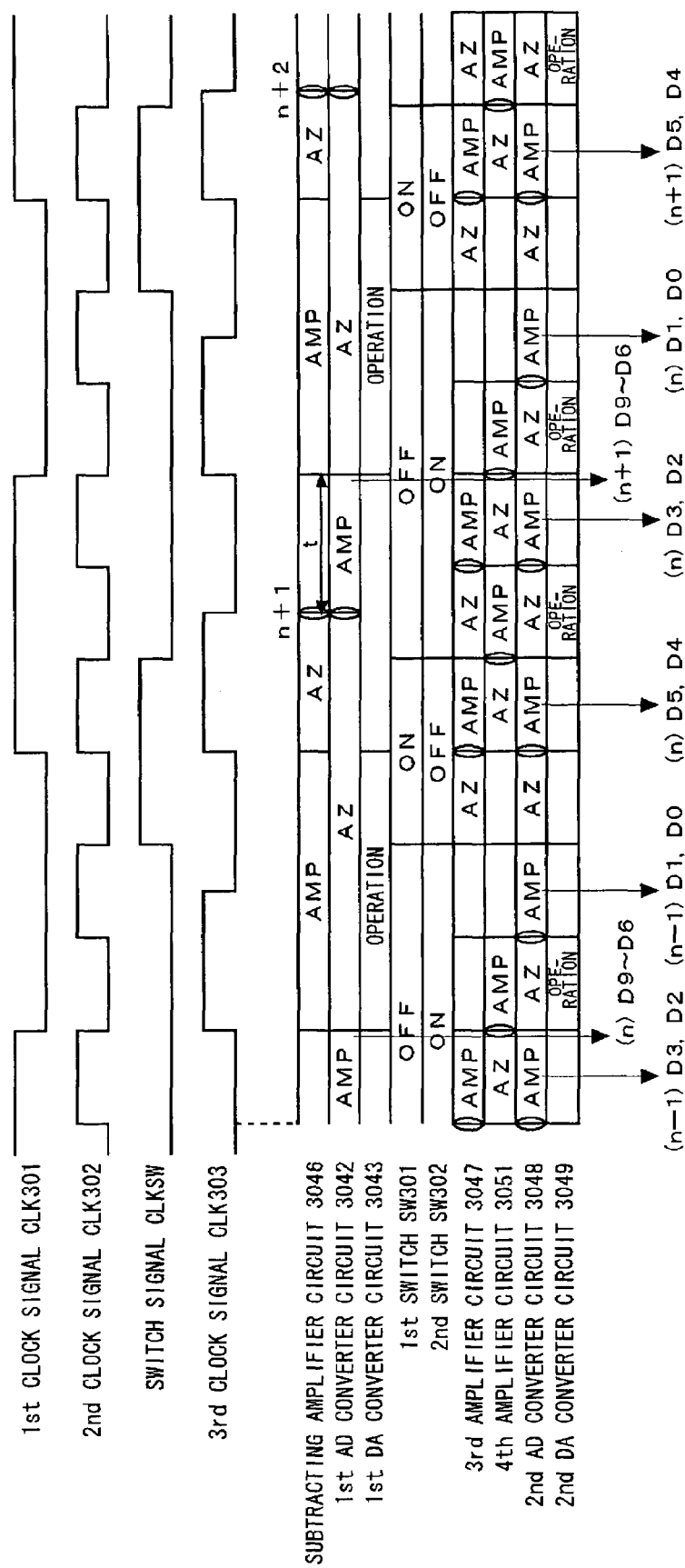
FIG. 27 is a time chart illustrating the operating process of the AD converter according to a comparative variation of the second example of the third embodiment.

A description will now be given of the timing of operation of the AD converter according to the second example. FIG. 27 is a time chart illustrating the operating process of the AD converter according to a comparative variation of the second example. Only the description of the preceding stage will be given since the subsequent stage is timed according to the same timing schedule of FIG. 26. A third clock signal CLK3 is necessary in this comparative variation. The frequency of the third clock signal CLK3 is twice as high as that of the first clock signal CLK1.

The first subtracting amplifier circuit 3046 samples the input analog signal Vin at every second falling edge of the third clock signal CLK3. The first subtracting amplifier circuit 3046 subtracts an output analog signal from the first DA converter circuit 3043 from the sampled analog signal Vin and amplifies a result of subtraction, when the first clock signal CLK1 is low. The first subtracting amplifier circuit 3046 is placed in an autozero operation mode while the third clock signal CLK3 is high in a period when the first clock signal CLK1 is high. An idle time, in which neither an autozero operation nor amplification is performed, is created while the third clock signal CLK3 is low in a period when the first clock signal CLK1 is high.

The first AD converter circuit 3042 samples the input analog signal Vin according to the same timing schedule as the first subtracting amplifier circuit 3046 sampling the input analog signal Vin. The first AD converter circuit 3042 is placed in an autozero operation mode in a period when the first clock signal CLK1 is low and in a subsequent period when the third clock signal CLK3 is high. In a subsequent period when the third clock signal CLK3 is low, the first AD converter circuit 3042 operates for comparison and outputs a result of comparison. The first DA converter circuit 3043 holds the data subjected to the DA conversion while the first clock signal CLK1 is low, and is in an undefined state while the first clock signal CLK1 is high.

As described above, an idle time, in which neither an autozero operation nor amplification is performed, is created in the first subtracting amplifier circuit 3046, according to this comparative variation. This is due to the fact that the first AD converter circuit 3042 and the first subtracting amplifier circuit 3046 sample the analog signal Vin according to the same timing schedule. More specifically, in contrast with the first AD converter circuit 3042, which is capable of starting an operation for comparison with the reference voltage, immediately after sampling the analog signal Vin, the first subtracting amplifier circuit 3046 cannot perform subtraction and amplification until the first DA converter circuit 3043 completes the DA conversion. Accordingly, the first AD converter circuit 3042 and the first subtracting amplifier circuit 3046 in the comparative variation should be controlled by the third clock signal CLK3 which is of a higher speed than the clock signal CLK used in the timing schedule of FIG. 26.

In contrast, in the example of operation illustrated in FIG. 26, the first AD converter circuit 3042 first samples the reference voltage and then receives the analog signal Vin in a period for comparison. With this, it is not necessary to advance the timing of sampling of the analog signal Vin by the first subtracting amplifier circuit 3046, with the result that a longer autozero period is secured than in the comparative variation. Accordingly, a signal such as the third clock signal CLK3 of the comparative variation, characterized by a higher speed, is not necessary.

Thus, according to the second example, the AD converter, in which a non-cyclic one-step amplification stage and a cyclic two-step amplification stage are mixed, can be operated without creating any idle time t. Further, the non-cyclic one-step amplification stage can be controlled by a single clock signal CLK. By configuring the first stage as a one-step amplification stage, the characteristics of the AD converter as a whole are improved. The signal input to the first stage is the largest since it is not processed by any subtracter circuits. When an amplifier circuit is provided parallel with the AD converter circuit as in the case of two-step amplification, the characteristics may be degraded due to the fact that the performance is bounded by the output voltage range of the amplifier circuit. When the power supply voltage is dropped, the output voltage range becomes less extensive accordingly, causing degradation to become more serious.

As described before, an advantage of two-step amplification is that the input signal can be amplified concurrently with the AD conversion in the stage where two-amplification is performed. Accordingly, the gain of the amplifier circuit for the second step may be lowered to enable a high-speed operation of the amplifier circuit. Therefore, the frequency of the first clock signal CLK1 and the second clock signal CLK2 maybe increased. Thus, according to the second example, improvement in the characteristics and a high-speed operation are both achieved without creating an idle time t.

(Third Example of the Third Embodiment)

A third example of the third embodiment provides an AD converter formed by adding a one-step amplification stage to the AD converter of the second example of the third embodiment, in which the first stage for one-step amplification converts into 4 bits, and the second stage for one-step amplification converts into 2 bits, and the cyclic stage for two-step amplification converts into 2 bits in each of three cycles, thus outputting a total of 12 bits.

Figure 28:
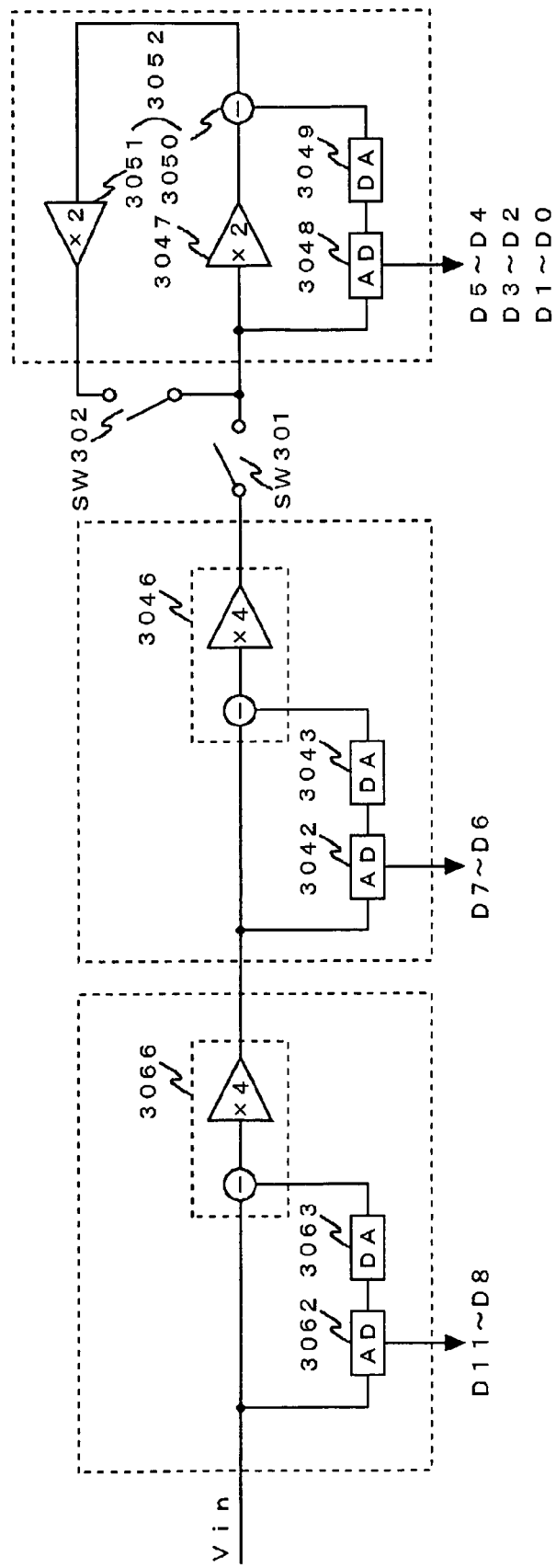
FIG. 28 illustrates the structure of an AD converter according to a third example of the third embodiment.

FIG. 28 illustrates the structure of an AD converter according to a third example of the third embodiment. The description of the second example of the third embodiment applies to the second and subsequent stages in this AD converter. A difference from the second example is that the second stage converts into 2 bits instead of 4 bits of the preceding stage of the second example of the third embodiment. When the reference voltage of the AD converter circuit of the second stage is set to be equal to the reference voltage of the AD converter circuit of the third stage, the gain of the second stage will be 4, as illustrated in FIG. 28. The description of the preceding stage of the second example of the third embodiment applies to the first stage, which is introduced in the third embodiment. The timing schedule for operation is basically the same as that of the time chart illustrated in FIG. 26. A AD converter circuit 3062, a DA converter circuit 3063 and a subtracting amplifier circuit 3066 are controlled by the first clock CLK1. The constituting elements of the second stage may be controlled by the first clock signal CLK1 or the second clock signal CLK2.

Thus, according to the third example, the AD converter, in which two stages for one-step amplification and a cyclic stage for two-step amplification are mixed, can be operated such without creating an idle time t. By configuring the first stage as a one-step amplification stage, the characteristics of the AD converter as a whole are improved. The advantage of the two-step amplification is that the AD converter as a whole can be operated at a high speed. Thus, according to the third example, improvement in the characteristics and a high-speed operation are both achieved without creating an idle time t.

Described above is a description of the third embodiment based on the examples. The description of the embodiment is illustrative in nature and various variations in constituting elements and processes involved are possible. Those skilled in the art would readily appreciate that the variations are also within the scope of the present invention.

Parameters such as the number of bits produced as a result of conversion, allocation of conversion bits, and the gain of the amplifier circuits given in the description above of the examples of the third embodiment are merely by way of example. Other parameter values may be employed in variations. The number of stages in the AD converter as a whole, the number of stages for one-step amplification, the number of stages for two-step amplification, the number of stages of a cyclic type and the number of stages of a non-cyclic type are arbitrarily configured.

Although the present invention has been described by way of exemplary embodiments, it should be understood that many changes and substitutions may further be made by those skilled in the art without departing from the scope of the present invention which is defined by the appended claims.

What is claimed is:

1. An analog-digital converter comprising:
   an analog-digital converter circuit converting an input analog signal into a digital value of a predetermined number of bits; and
   an input switching circuit switching between a voltage value of said analog signal and a predetermined reference voltage value for input to voltage comparison elements constituting said analog-digital converter circuit, wherein
   the analog-digital converter circuit is alternately operated in a first period in which it is in an autozero operation mode and a second period in which it compares the voltage value of said analog signal with the predetermined reference voltage value for conversion, and
   said input switching circuit switches between a mode, in which the voltage value of said analog signal is received in the first period and the reference voltage value is received in the second period, and a mode, in which the reference voltage value is received in the first period and the voltage value of said analog signal is received in the second period, according to a timing schedule of the other constitutes elements.

2. An analog-digital converter comprising:
   an analog-digital converter circuit converting an input analog signal into a digital value of a predetermined number of bits;
   a digital-analog converter circuit converting an output of said analog-digital converter into an analog signal;
   a subtracter circuit subtracting an output analog signal from said digital-analog circuit from said input analog signal;
   an amplifier circuit amplifying an output of said subtracter circuit; and
   an input switching circuit switching between a voltage value of said analog signal and a predetermined reference voltage value for input to voltage comparison elements constituting said analog-digital converter circuit, wherein
   the analog-digital converter circuit is alternately operated in a first period in which it is in an autozero operation mode and a second period in which it compares the voltage value of said analog signal with the predetermined reference voltage value for conversion, and
   said input switching circuit switches between a mode, in which the voltage value of said analog signal is received in the first period and the reference voltage value is received in the second period, and a mode, in which the reference voltage value is received in the first period and the voltage value of said analog signal is received in the second period, according to a timing schedule of the amplifier circuit.

3. An analog-digital converter comprising:
   an analog-digital converter circuit converting an input analog signal into a digital value of a predetermined number of bits;
   a digital-analog converter circuit converting an output of said analog-digital converter into an analog signal;
   a subtracter circuit subtracting an output analog signal from said digital-analog circuit from said input analog signal;
   an amplifier circuit amplifying an output of said subtracter circuit;
   a sample and hold circuit provided between an input to the analog-digital converter and said subtracter circuit, and sampling and holding said input analog signal; and
   a switch connecting said input to the analog-digital converter with said subtracter circuit directly or via said sample and hold circuit, wherein
   said input switching circuit switches between the voltage value of said analog signal and said reference voltage value according to a timing schedule of the operation of said amplifier circuit; and
   said input switching circuit feeds said reference voltage value first and then the voltage value of said input analog signal, while said switch is selecting a direct route.

4. An analog-digital converter of a pipeline type or a cyclic type, comprising:
   an analog-digital converter circuit converting an input analog signal into a digital value of a predetermined number of bits;
   a digital-analog converter circuit converting an output of said analog-digital converter into an analog signal;
   a subtracter circuit subtracting an output analog signal from said digital-analog circuit from said input analog signal;
   an amplifier circuit amplifying an output of said subtracter circuit; and
   an input switching circuit switching between a voltage value of said analog signal and a predetermined reference voltage value for input to voltage comparison elements constituting said analog-digital converter circuit, wherein
   said input switching circuit switches between a voltage value of a first input signal from a preceding stage, a voltage value of a second input signal fed back from a subsequent stage and said reference voltage, in accordance with a timing schedule of the operation of said amplifier circuit.

5. The analog-digital converter according to claim 4, wherein said input switching circuit switches between the voltage value of the first input signal from the preceding stage, a first reference voltage value for the first input signal, the voltage value of the second input signal fed back from the subsequent stage and a second reference voltage value for the second input signal, in accordance with the timing schedule of the operation of said amplifier circuit.

6. An analog-digital converter converting an input analog signal into a digital value in discrete steps, comprising:
  a plurality of stages each converting an input analog signal into a digital value of a predetermined number of bits, wherein
  at least one of said plurality of stages is a stage amplifying an analog signal input to the stage by an amplifier element, said amplifier element being a first subtracting amplifier circuit which samples and holds the analog signal input to the stage, subtracts a value obtained by analog-to-digital conversion in the stage from said analog signal held by said first subtracting amplifier circuit, and amplifies a result of subtraction, and
  at least one other of said plurality of stages is a stage amplifying the analog signal input to the stage by a plurality of amplifier elements, one of said plurality of amplifier elements being a sample and hold circuit which samples and holds the analog signal input to the stage, or an amplifier circuit which samples the analog signal input to the stage and amplifies the sampled signal by a predetermined gain, and each of the others of said plurality of amplifier elements being a second subtracting amplifier circuit which subtracts a value obtained by analog-to-digital conversion in the stage from an output analog signal from said sample and hold circuit or said amplifier circuit, and which amplifies a result of subtraction, wherein said first subtracting amplifier circuit holds said sampled input analog signal until the conversion of the digital value, resulting from the analog-to-digital conversion in the stage, into an analog value is completed.

7. The analog-digital converter according to claim 6, wherein said first subtracting amplifier circuit directly samples an analog signal input to a stage in which is included said first subtracting amplifier circuit, according to the same timing schedule in which said analog signal is sampled in said stage for conversion into a digital value.

8. The analog-digital converter according to claim 7, wherein said stage including said first subtracting amplifier circuit is a first stage.

9. The analog-digital converter according to claim 7, wherein an arbitrary stage selected from said plurality of stages is a cyclic stage which feeds an output analog signal from said arbitrary stage back to the input of said arbitrary stage.

10. The analog-digital converter according to claim 7, wherein said first subtracting amplifier circuit holds said sampled input analog signal until the conversion of the digital value, resulting from the analog-to-digital conversion in the stage, into an analog value is completed.

11. The analog-digital converter according to claim 7, wherein said first subtracting amplifier circuit amplifies in a period of time longer than an autozero period.

12. The analog-digital converter according to claim 6, wherein said stage including said first subtracting amplifier circuit is a first stage.

13. The analog-digital converter according to claim 6, wherein an arbitrary stage selected from said plurality of stages is a cyclic stage which feeds an output analog signal from said arbitrary stage back to the input of said arbitrary stage.

14. An analog-digital converter converting an input analog signal into a digital value in discrete steps, comprising:
  a plurality of stages each converting an input analog signal into a digital value of a predetermined number of bits, wherein
  at least one of said plurality of stages is a stage amplifying an analog signal input to the stage by an amplifier element, said amplifier element being a first subtracting amplifier circuit which samples and holds the analog signal input to the stage, subtracts a value obtained by analog-to-digital conversion in the stage from said analog signal held by said first subtracting amplifier circuit, and amplifies a result of subtraction, and
  at least one other of said plurality of stages is a stage amplifying the analog signal input to the stage by a plurality of amplifier elements, one of said plurality of amplifier elements being a sample and hold circuit which samples and holds the analog signal input to the stage, or an amplifier circuit which samples the analog signal input to the stage and amplifies the sampled signal by a predetermined gain, and each of the others of said plurality of amplifier elements being a second subtracting amplifier circuit which subtracts a value obtained by analog-to-digital conversion in the stage from an output analog signal from said sample and hold circuit or said amplifier circuit, and which amplifies a result of subtraction, wherein said first subtracting amplifier circuit amplifies in a period of time longer than an autozero period.

15. The analog-digital converter according to claim 14, wherein said first subtracting amplifier circuit directly samples an analog signal input to a stage in which is included said first subtracting amplifier circuit, according to the same timing schedule in which said analog signal is sampled in said stage for conversion into a digital value.

16. The analog-digital converter according to claim 15, wherein said stage including said first subtracting amplifier circuit is a first stage.

17. The analog-digital converter according to claim 15, wherein an arbitrary stage selected from said plurality of stages is a cyclic stage which feeds an output analog signal from said arbitrary stage back to the input of said arbitrary stage.

18. The analog-digital converter according to claim 14, wherein said stage including said first subtracting amplifier circuit is a first stage.

19. The analog-digital converter according to claim 14, wherein an arbitrary stage selected from said plurality of stages is a cyclic stage which feeds an output analog signal from said arbitrary stage back to the input of said arbitrary stage.

20. An analog-digital converter converting an input analog signal into a digital signal in a plurality of steps using a plurality of stages, wherein
  each of the plurality of stages is provided with an analog-digital converter circuit comparing an input analog signal with a predetermined voltage and converting the analog signal into a digital value of a predetermined number of bits, and each of the plurality of stages is configured such that the input of said analog signal and the input of said predetermined reference voltage to said analog-digital converter circuit occur in whichever order desired, and
  the sequence of operation of said analog-digital converter circuit differs in accordance with the structure of stages such that, said analog-digital converter circuit samples said analog signal at the end of a non-operating period and receives said predetermined reference voltage in a period of time for comparison, or samples said reference voltage at the end of the non-operating period and receives said analog signal in the period of time for comparison.

21. The analog-digital converter according to claim 20, wherein the AD converter circuit of a first stage first sample the predetermined reference voltage and then receive the analog signal input to the stage in a period of time comparison.

22. The analog-digital converter according to claim 20, wherein said plurality of stages include a stage which feeds an output analog signal from the stage back to the input of the stage.

23. An analog-digital converter converting an input analog signal into a digital signal in a plurality of discrete steps using a plurality of stages, comprising at least one each of:
  a stage of a first type provided with an amplifier element: and
  a stage of a second type provided with two amplifier elements, wherein
  an analog-digital converter circuit of the stage of said first type first samples a predetermined reference voltage and then receives an analog signal input to the stage in a period of time for comparison, and an analog-digital converter circuit of the stage of said second type first samples an analog signal input to the stage and then receives a predetermined reference voltage in a period of time for comparison.

24. The analog-digital converter according to claim 23, wherein the AD converter circuit of a first stage first sample the predetermined reference voltage and then receive the analog signal input to the stage in a period of time comparison.

25. The analog-digital converter according to claim 23, wherein said plurality of stages include a stage which feeds an output analog signal from the stage back to the input of the stage.

26. An analog-digital converter converting an input analog signal into a digital signal in a plurality of discrete steps using a plurality of stages, comprising at least one each of:
  a stage of a first type which includes an analog-digital converter circuit comparing an analog signal input to the stage with a predetermined reference voltage so as to convert the analog signal into a digital of a predetermined number of bits, and a subtracting amplifier circuit sampling said analog signal and subtracting therefrom an analog signal corresponding to the digital value produced by conversion by said analog-digital converter circuit, and amplifying the analog signal after the subtraction by a predetermined gain; and
  a stage of a second type which includes an analog-digital converter circuit comparing an analog signal input to the stage with a predetermined reference voltage so as to convert the analog signal into a digital of a predetermined number of bits, a first amplifier circuit sampling said analog signal and amplifying the sampled signal by a predetermined gain or holding the sampled signal, a subtracter circuit subtracting, from an output analog signal from said first amplifier circuit, an analog signal corresponding to the digital value produced by conversion by said analog-digital converter circuit, and a second amplifier circuit amplifying an output analog signal from said subtracter circuit by a predetermined gain, wherein
  the analog-digital converter circuit of the stage of said first type first samples the predetermined reference voltage and then receives the analog signal input to the stage in a period of time for comparison, and the analog-digital converter circuit of the stage of said second type first samples the analog signal input to the stage and then receives the predetermined reference voltage in a period of time for comparison.

27. The analog-digital converter according to claim 26, wherein the AD converter circuit of a first stage may first sample the predetermined reference voltage and then receive the analog signal input to the stage in a period of time comparison.

28. The analog-digital converter according to claim 26, wherein said plurality of stages include a stage which feeds an output analog signal from the stage back to the input of the stage.

* * * * *